(12) United States Patent
Hemnani et al.

(10) Patent No.: US 10,919,280 B2
(45) Date of Patent: Feb. 16, 2021

(54) TWO-DIMENSIONAL MATERIAL PRINTER AND TRANSFER SYSTEM AND METHOD FOR ATOMICALLY LAYERED MATERIALS

(71) Applicant: The George Washington University, Washington, DC (US)

(72) Inventors: Rohit Anil Hemnani, Washington, DC (US); Volker J. Sorger, Alexandria, VA (US)

(73) Assignee: The George Washington University, Washington, DC (US)

( * ) Notice: Subject to any disclaimer, the term of this patent is extended or adjusted under 35 U.S.C. 154(b) by 94 days.

(21) Appl. No.: 16/121,156

(22) Filed: Sep. 4, 2018

(65) Prior Publication Data

US 2019/0070840 A1 Mar. 7, 2019

Related U.S. Application Data

(60) Provisional application No. 62/553,400, filed on Sep. 1, 2017.

(51) Int. Cl.
*B32B 37/10* (2006.01)
*B32B 37/00* (2006.01)
(Continued)

(52) U.S. Cl.
CPC ............ *B32B 37/025* (2013.01); *B32B 41/00* (2013.01); *B82Y 10/00* (2013.01); *B82Y 40/00* (2013.01);
(Continued)

(58) Field of Classification Search
CPC .... B32B 37/025; B81C 1/00373; B82Y 40/00
See application file for complete search history.

(56) References Cited

U.S. PATENT DOCUMENTS 5,300,170 A * 4/1994 Donohoe .................. B44C 1/16
100/207
8,029,643 B2 * 10/2011 Sanocki .................. B32B 38/10
156/716
(Continued)

OTHER PUBLICATIONS

M. Bernardi, et al., "Extraordinary Sunlight Absorption and One Nanometer Thick Photovoltaics Using Two-Dimensional Monolayer Materials", Nano Letters, vol. 13, 2013, pp. 3664-3670.
(Continued)

*Primary Examiner* — Scott W Dodds
(74) *Attorney, Agent, or Firm* — Blank Rome LLP

(57) ABSTRACT

Precision and chip contamination-free placement of two-dimensional (2D) material and van der Waals (VDW) layered materials accelerates both the study of fundamental properties and novel device functionality. The system transfers 2D materials utilizing a combination of a narrow transfer-stamper and viscoelastic and optically transparent film. Precise placement of individual 2D materials results in vanishing cross-contamination to the substrate. The 2D printer results in an aerial cross-contamination improvement of two to three orders of magnitude relative to state-of-the-art transfer methods from a source of average area sub um^2. The transfer-stamper does not physically harm any micro/nanostructures preexisting on the target substrates receiving the 2D material such as, nanoelectronics, waveguides or micro-ring resonators. Such accurate and substrate-benign transfer method for 2D and VDW layered materials provides rapid device prototyping due to its high time-reduction, accuracy, and contamination-free process.

19 Claims, 10 Drawing Sheets

(51) Int. Cl.
- B32B 41/00 (2006.01)
- H01L 29/16 (2006.01)
- B82Y 40/00 (2011.01)
- H01L 21/762 (2006.01)
- B82Y 10/00 (2011.01)
- H01L 29/778 (2006.01)
- H01L 29/66 (2006.01)

(52) U.S. Cl.
CPC ........ H01L 21/762 (2013.01); H01L 29/1606 (2013.01); *H01L 29/66045* (2013.01); *H01L 29/778* (2013.01)

(56) References Cited

U.S. PATENT DOCUMENTS

| | | | |
|---|---|---|---|
| 2011/0058150 A1* | 3/2011 | Schaper | G03B 27/42 355/53 |
| 2013/0069275 A1* | 3/2013 | Menard | B32B 9/005 264/293 |

OTHER PUBLICATIONS

K. S. Novoselov, et al., "Electric Field Effect in Atomically Thin Carbon Films", www.sciencemag.org, vol. 306, Oct. 22, 2004, pp. 666-669.
Transfer System: HQ Graphene; info@hgraphene.com; 1 page.
2D Heterostructure Transfer System, hq graphene, http://hgraphene.com/TransferSystem.php; Jun. 2020, 3 pgs.
B. V. Lotsch, et al., "Vertical 2D Heterostructures", Annu. Rev. Mater. Res., www.annualreviews.org; 2015, vol. 45; pp. 85-109.
A. Castellanos-Gomez, at al., "Deterministic Transfer of Two-Dimensional Materials by All-Dry Viscoelastic Stamping", 2D Materials, vol. 1, 2014; 9 pgs.
H. Li, et al., "Rapid and Reliable Thickness Identification of Two-Dimensional Nanosheets Using Optical Microscopy", www.acsnano.org; vol. 7, No. 11; Oct. 2013; pp. 10344-10353.
D. J. Late, et al., "Rapid Characterization of Ultrathin Layers of Chalcogenides on SiO2/Si Substrates", Advanced Functional Materials; Material Views, www.materialviews.com; 2012; vol. 22; pp. 1894-1905.
M. A. Meitl, et al., "Transfer Printing by Kinetic Control of Adhesion to an Elastomeric Stamp", www.nature.com/naturematerials; vol. 5, Jan. 2006; pp. 33-38.
Yuan-Fu Chen, et al., "Rapid Determination of the Thickness of Graphene Using the Ratio of Color Difference", The Journal of Physical Chemistry C; pubs.acs.org/JPCC; 2011; vol. 115; pp. 6690-6693.
Z. Ma, et al., "2D Materials in Electro-Optic Modulation: Energy Efficiency, Electrostatics, Mode Overlap, Material Transfer and Integration", Applied Physics A, vol. 124-126; 2018; 7 pgs.
G. Flachinger, et al., "A Direct Comparison of CVD-Grown and Exfoliated MoS2 Using Optical Spectroscopy", Semiconductor Science and Technology; vol. 29, 2014: 9 pgs.
R. Amin et al., "Waveguide-Based Electro-Absorption Modulator Performance. Comparative Analysis", Optics Express; vol. 26, No. 12; Jun. 2018; pp. 15445-15470.
G. F. Schneider, et al., "Wedging Transfer of Nanostructures", Nano Letters, pubs.acs.org/NanoLett; 2010; vol. 10; pp. 1912-1916.
N. Li, et al., "Monolithic III-V on Silicon Plasmonic Nanolaser Structure for Optical Interconnects", Scientific Reports, www.nature.com/scientificreports; Sep. 2015, pp. 1-9.
P. J. Zomer et al., "A Transfer Technique for High Mobility Graphene Devices on Commercially Available Hexagonal Boron Nitride", Applied Physics Letters, vol. 99; 2011; pp. 232104-1-232104-3.

K. Liu, et al., "Electrically-Driven Carbon Nanotube-Based Plasmonic Laser on Silicon", Optical Materials Express, vol. 5, No. 9. Sep. 2015; pp. 1910-1919.
H. Zhang, "Ultrathin Two-Dimensional Nanometerials", www.acsnano.org; vol. 9, No. 10; 2015; pp. 9451-9469.
L. Song. et al., "Large Scale Growth and Characterization of Atomic Hexagonal Boron Nitride Layers", Nano Letters; pubs.acs.org/NanoLett; vol. 10; 2010; pp. 3209-3215.
J. Xue, et al., "Scanning Tunnelling Microscopy and Spectroscopy of Ultra-Flat Graphene on Hexagonal Boron Nitride", Nature Materials, www.nature.com/naturematerials; vol. 10; Apr. 2011; pp. 262-285.
M. H. Tahersima, et al., "Testbeds for Transition Metal Dichalcogenide Photonics: Efficacy of Light Emission Enhancement in Monomer vs. Dimer Nanoscale Antennae", ACS Photonics, pubs.acs.org/journal/apch5; vol. 4; 2017; pp. 1713-1721.
G. R. Bhimartapati, et al., "Recent Advances in Two-Dimensional Materials Beyond Graphene", www.acsnano.org; vol. 9, No. 12; 2015; pp. 11509-11539.
L. Li, et al., "Black Phosphorus Field-Effect Transistors", Nature Nanotechnology, www.nature.com/naturenanotechnology, vol. 9; May 2014; pp. 372-377.
J. Kang, et al., "Electronic Structural Moiré Pattern Effects on MoS2/MoSe2 2D Heterostructures", Nano Letters, pubs.acs.org/NanoLett; 2013; vol. 13; pp. 5485-5490.
F. Xia, et al., "Rediscovering Black Phosphorus as an Anisotropic Layered Material for Optoelectronics and Electronics", Nature Communications, www.nature.com/naturecommunications; Jul. 2014; pp. 1-6.
K. F. Mak, et al., "Photonics and Optoelectronics of 2D Semiconductor Transition Metal Dichalcogenides", Nature Photonics, www.nature.com/naturephotonics; vol. 10; Apr. 2016; pp. 216-226.
R. K. Chowdhury, et al., "Novel Silicon Compatible p-W52 2D/3D Heterojunction Devices Exhibiting Broadband Photoresponse and Superior Detectivity", Nanoscale; vol. 8; 2016; pp. 13429-13436.
Y. Lui, et al., "Two-Dimensional Mono-Elemental Semiconductor with Electronically Inactive Defects: The Case of Phosphorus", Nano Letters, pubs.acs.org/NanoLett: vol. 14; 2014; pp. 6782-6786.
K. F. Mak, et al., "Atomically Thin MoS2: A New Direct-Gap Semiconductor", Physical Review Letters: Sep. 2010; vol. 105; pp. 136805-1-136805-4.
L. Britnell, et al., "Strong Light-Matter Interactions in Heterostructures of Atomically Thin Films", www.sciencemag.org, vol. 340; Jun. 2013; pp. 1311-1314.
S. Mukherjee, et al., "Tunable Direct Bandgap Optical Transitions in MoS2 Nanocrystals for Photonic Devices", ACS Photonics, pubs.acs.org/journal/apchd5; vol. 2; 2015; pp. 760-768.
F. Xia, et al., "Two-Dimensional Material Nanophotonics", Nature Photonics, www.nature.com/naturephotonics; Dec. 2014; vol. 8; pp. 899-907.
G.H. Lee, et al., "Flexible and Transparent MoS2 Field-Effect Transistors on Hexagonal Boron Nitride-Graphene Heterostructures", www.acsnano.org; vol. 7; No. 9; 2013; pp. 7931-7936.
L. F. Mattheiss, "Band Structures of Transition-Metal-Dichalcogenide Layer Compounds", Physical Review B; vol. 8; No. 8; Oct. 1973; pp. 3719-3740.
M. H. Tahersima, et al., "Enhanced Photon Absorption in Spiral Nanostructured Solar Cells Using Layered 2D Materials", Nanotechnology; vol. 26; 2015; 8 pgs.
Q. H. Wang, et al., "Electronics and Optoelectronics of Two-Dimensional Transition Metal Dichalcogenides", Nature Nanotechnology, www.nature.com/naturenanotechnology; vol. 7; Nov. 212; pp. 699-712.
M. Bernardi; et al., "Extraordinary Sunlight Absorption and One Nanometer Thick Photovoltaics Using Two-Dimensional Monolayer Materials", American Chemical Society, Nano Letters, pubs.acs.org/NanoLett; vol. 13, 2013, pp. 3664-3670.

\* cited by examiner

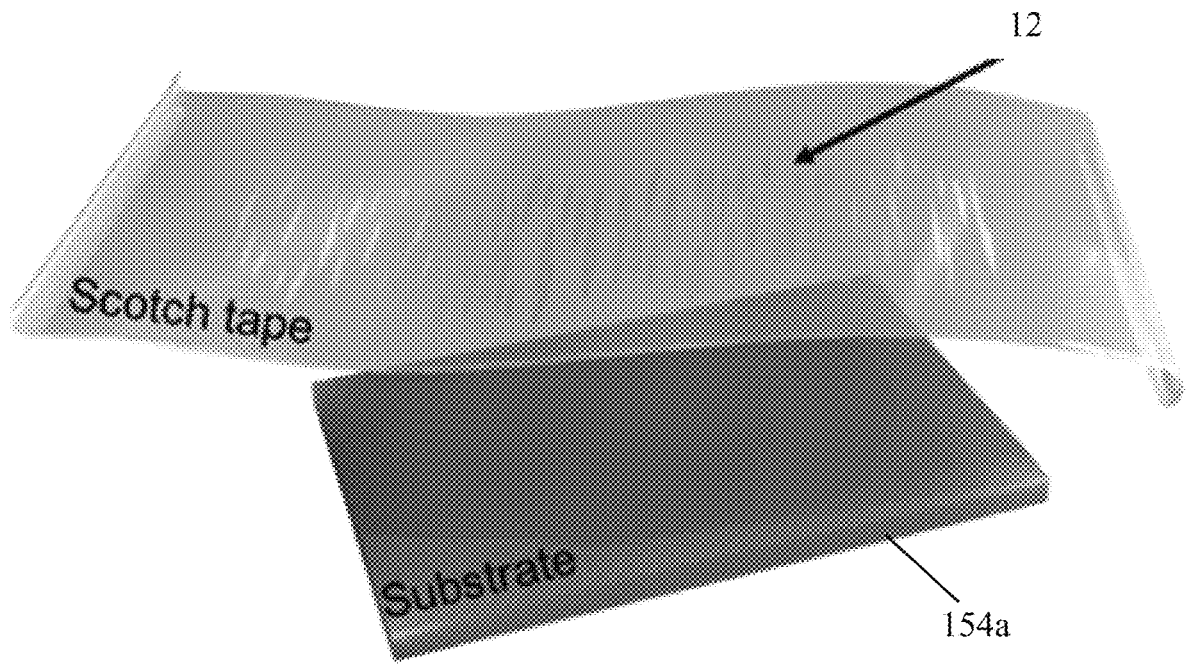
Figure 1(a) – PRIOR ART
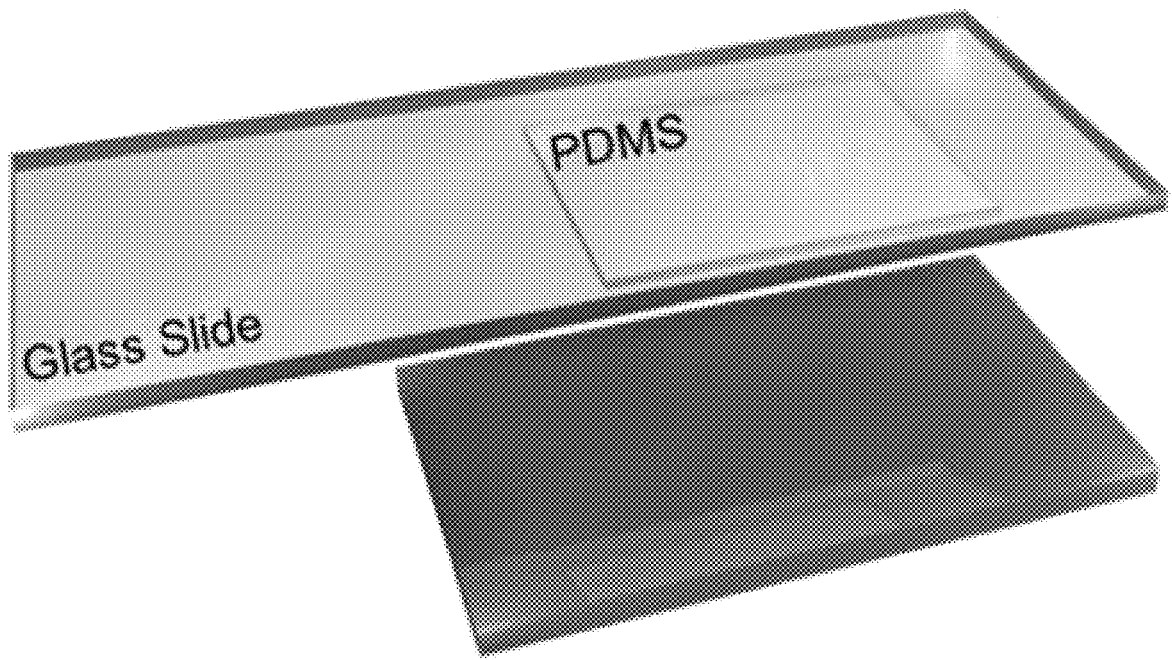
Figure 1(b) – PRIOR ART

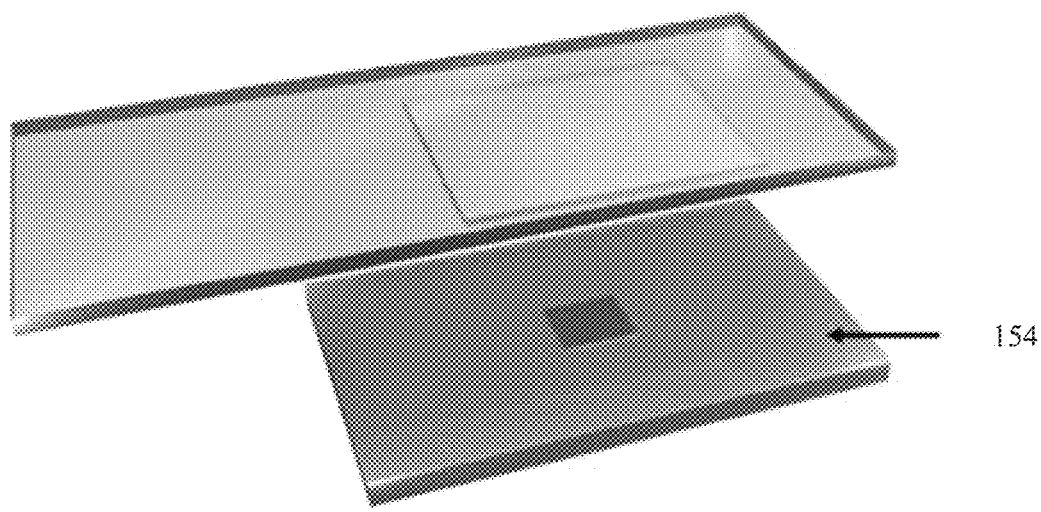
Figure 1(c) – PRIOR ART
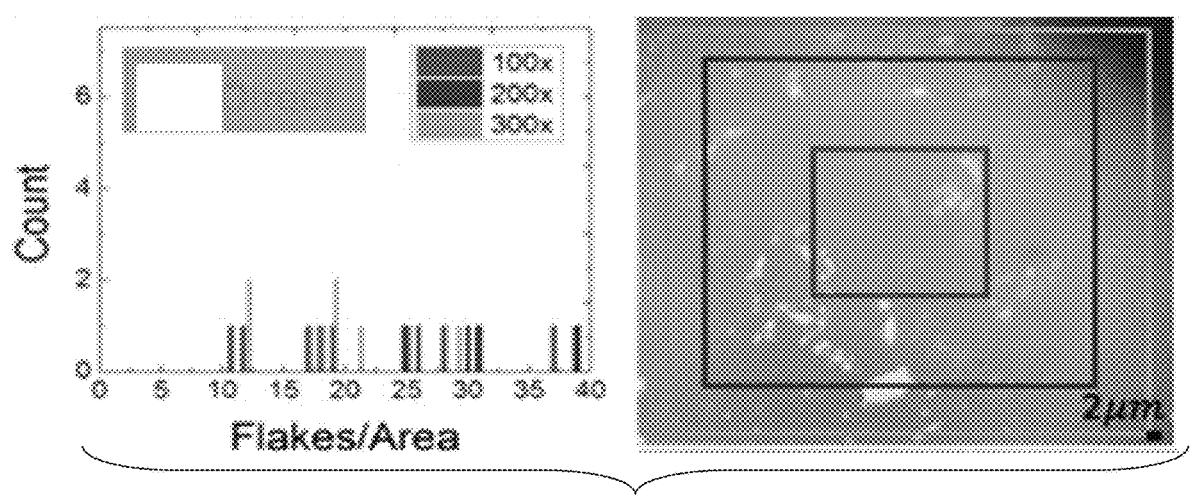
Figure 2(a) – PRIOR ART

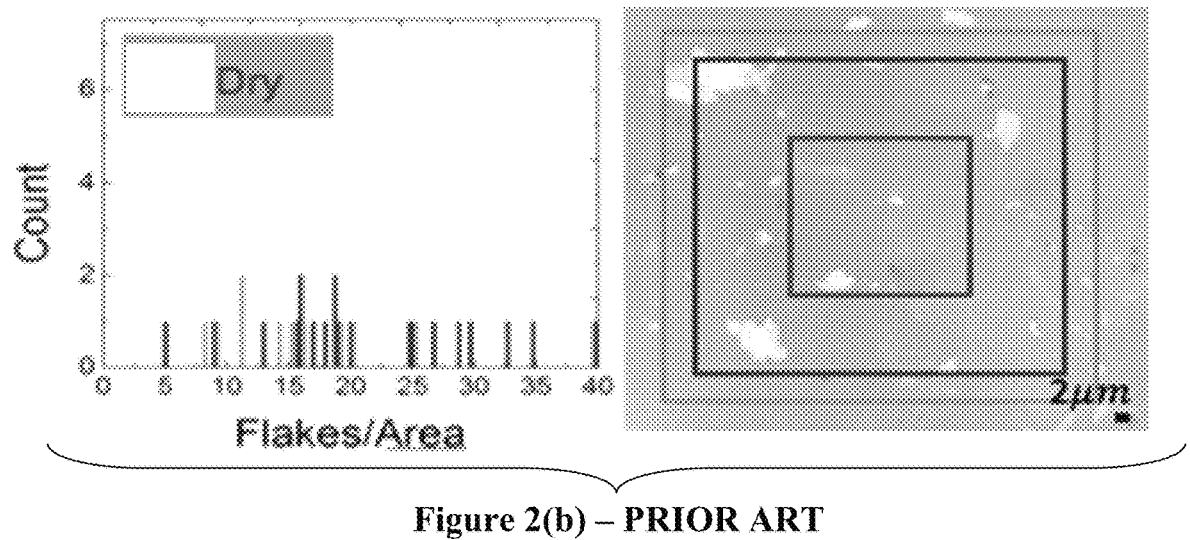
Figure 2(b) – PRIOR ART
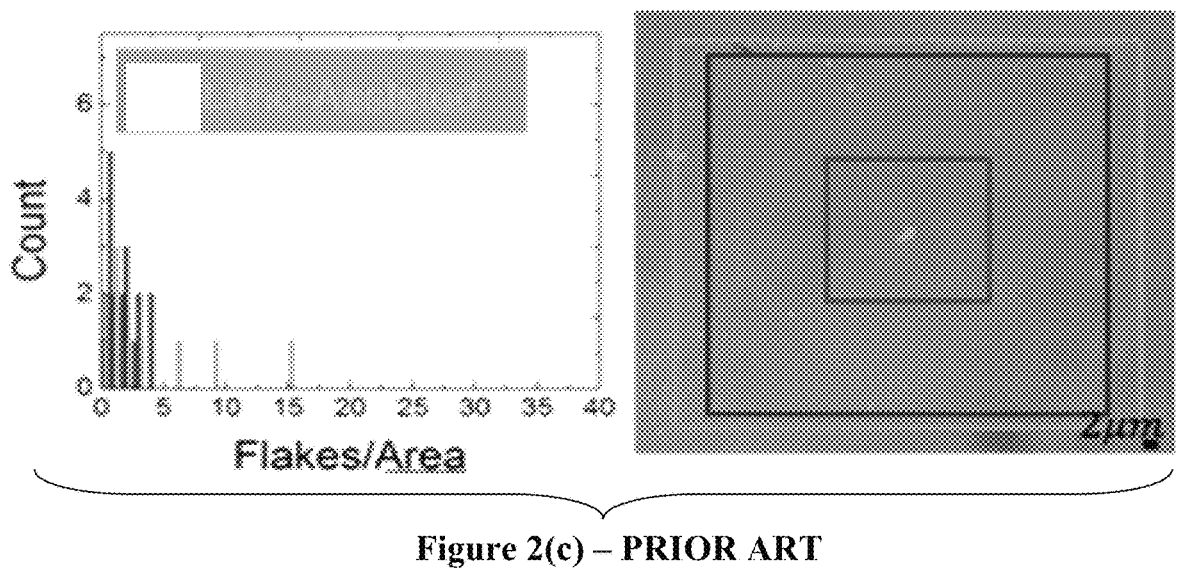
Figure 2(c) – PRIOR ART

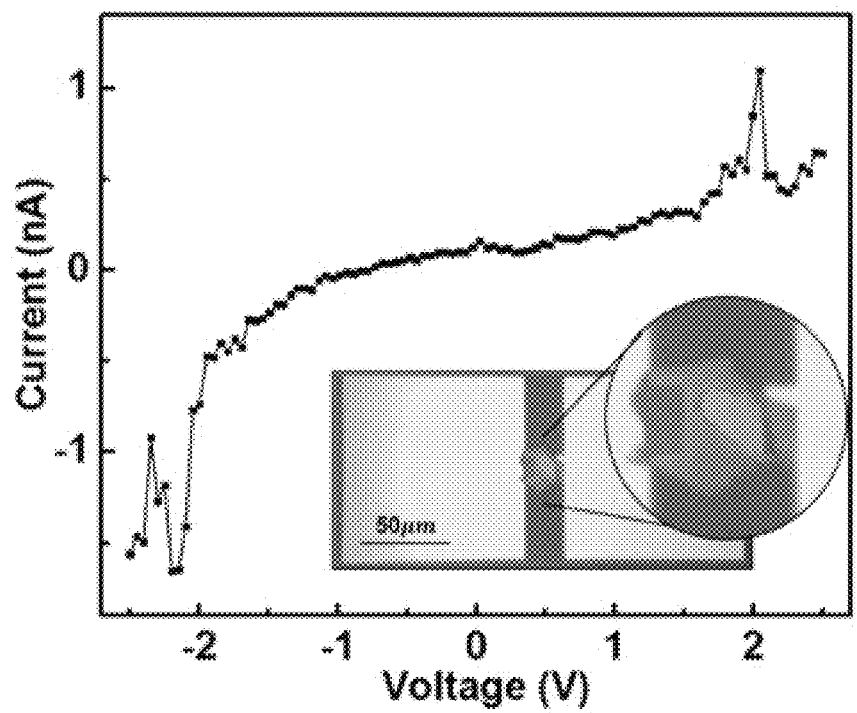
Figure 8(c)
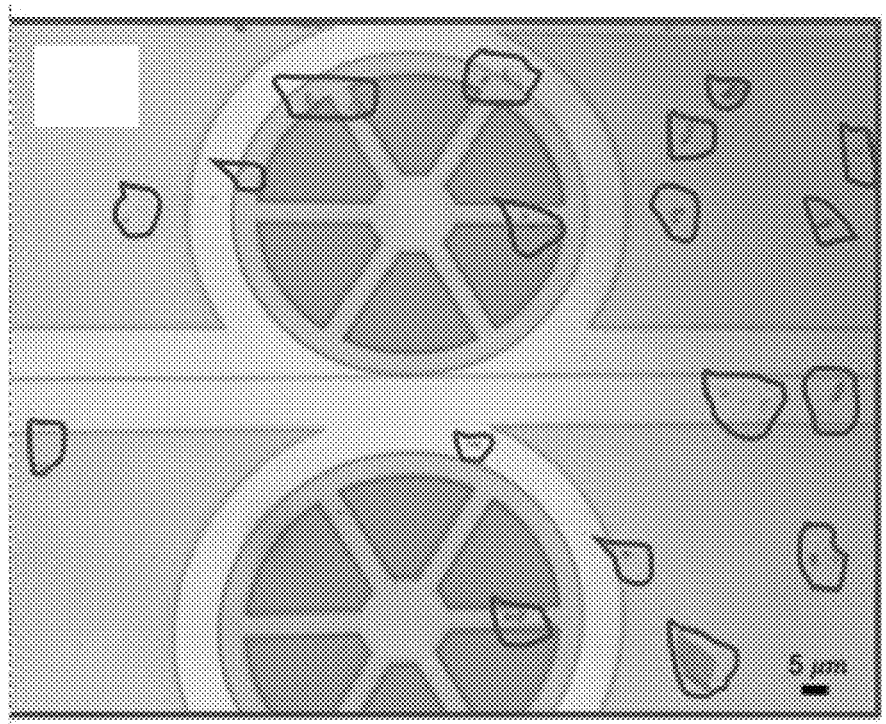
Figure 8(d) – PRIOR ART

TWO-DIMENSIONAL MATERIAL PRINTER AND TRANSFER SYSTEM AND METHOD FOR ATOMICALLY LAYERED MATERIALS

RELATED APPLICATIONS

This application claims the benefit of U.S. Provisional Application No. 62/553,400, filed Sep. 1, 2017, the entire contents of which are incorporated herein by reference.

GOVERNMENT LICENSE RIGHTS

This invention was made with Government support under Contract No. 1436330 awarded by NSF. The U.S. Government has certain rights in this invention.

BACKGROUND OF THE INVENTION

Field of the Invention

The present invention relates to a two-dimensional material printer. More particularly, the present invention relates to a system and method for transfer of atomically layered materials.

BACKGROUND OF THE RELATED ART

Two-dimensional (2D) materials hold promise for atomic-scale and highly-functional electronic and photonic devices by taking advantage of their rich physical properties which are fundamentally different from their bulk counterparts. [1]-[7] The diverse bandgap range of atomically-layered materials include insulators hexagonal Boron Nitride (hBN), semiconductors ($MoS_2$, $MoSe_2$, $WS_2$ etc.), and semimetals (graphene) providing the opportunity to realize heterostructures without the conventional lattice mismatch known from, for instance, integrating III-V materials with group IV substrates. [8]-[17]

Graphene, the first member of the 2D family, shows semi metallic electronic properties and has proven to be a key active material for a wide range of applications including in the optoelectronic industry. [2], [3] On the other hand, semiconductor transition metal dichalcogenides (TMDCs) and black phosphorus demonstrate thickness dependent bandgap tunability covering the visible and near infrared spectrum and direct bandgap with high emission yields. [18]-[21] Additionally, hBN is an ideal insulator for 2D material heterostructure platform given its bandgap of ~5.9 eV. [11]-[13] Strong in-plane covalent bonds provide stability of 2D crystals, whereas the vertical layers of 2D material are held together by weak Van der Waals forces and can be easily separated through the mechanical exfoliation method. [21]

In contrast, chemical vapor deposition (CVD) offers chip-scale 2D material growth relevant for industry. [22] However, in addition to quality imperfections, both the thermal budget and substrate incompatibility currently limit CVD growth methods, despite significant progress having been made. [23]

Hence, the scalability of obtaining these 2D materials and the ability to reliably transfer a 2D material flake onto an arbitrary substrate with minimum cross-contamination remains challenging unless it is a single transfer from a clean source of 2D material flakes. The capability to transfer, for instance, a single flake to a target area from a relatively dense source is important because neighboring features such as other devices, circuits, or photonics waveguide structures, could be harmed if the 2D material flake areas are randomly introduced onto the target substrate. On the other hand, it will enable to transfer multiple times from a given source.

Previous transfer approaches, such as the wedging method, use wet chemistry to transfer 2D materials. [24] Whereas, the polymer (evalcite) transfer method involves the substrate heating and wet chemistry to obtain a successful transfer. [25] As described, current transfer methods do not encompass the precautions to protect neighboring devices; this could become critical for heterogeneous integration such as carried out in Silicon photonics. [26], [27] With each method, there is a drawback that could harm a specific electronic or photonic device, whether it be chemicals, heating, excess residue, etc.

Precision and chip contamination-free placement of two-dimensional (2D) materials is expected to accelerate both the study of fundamental properties and novel device functionality. But current deterministic transfer methods of 2D materials onto an arbitrary substrate deploy viscoelastic stamping. However, these methods produce a) significant cross-contamination of the substrate inherent from typical dense sources of 2D material flakes and b) are challenged with respect to spatial alignment, and c) multi-transfer at a single step.

Referring to FIG. 1, several techniques of dry transfer of 2D materials are illustrated: Direct or Scotch tape exfoliation technique (FIG. 1(a)), Dry (FIG. 1(b)), and Lithography (also referred to here as Litho Assisted) (FIG. 1(c)). FIG. 1(a) is a direct transfer technique. See K. S. Novoselov et al, Electric Field Effect in Atomically Thin Carbon Films, Science 22 Oct. 2004: Vol. 306, Issue 5696, pp. 666-669 DOI: 10.1126/science.1102896. Here, a piece of scotch tape with exfoliated flakes on it is directly placed onto the substrate. The mechanical exfoliation involves placing a bulk crystal or substrate between two pieces of adhesive tape (Scotch or Nitto tape) and then peeling one tape off the other. [28] This action breaks weak Van der Waals interactions keeping the layers of crystal together and essentially thins it down. This procedure is repeated numerous times until ideally a flake with desired thickness is obtained. This simple and quick approach always offers optimal quality layered materials. However, one major limitation is to control the thickness and lateral dimensions of the flakes. The obtained flakes differ considerably in size and thickness, where the sizes range from nanometers to several tens of micrometers for single to few layers 2D materials.

Turning to FIG. 1(b), a schematic is shown of the deterministic dry transfer method. See Andres Castellanos-Gomez et al., Deterministic transfer of two-dimensional materials by all-dry viscoelastic stamping, Published 4 Apr. 2014 IOP Publishing Ltd, 2D Materials, Volume 1, Number 1. The exfoliated flakes are transferred to a Polydimethylsiloxane (PDMS) gel from the scotch tape and the gel is then aligned with the substrate. Since the PDMS is transparent, it is possible to see both the flake on the gel and the target area on the substrate simultaneously. Both the gel and the substrate are on micromanipulator stages, once the flake is aligned with the target area, we lower the gel to the substrate. We then lift off the gel slowly, leaving the flakes on the substrate.

Turning to FIG. 1(c), a schematic is shown of the lithography-assisted deterministic dry transfer method (Litho-Assisted). The same steps of the Dry transfer method are followed. However, the substrate is coated in PMMA and an opening created by using Electron Beam Lithography (EBL). When the PDMS gel is push down on the PMMA coated substrate, all the flakes in contact with the PMMA/ substrate will transfer but only the flakes that are within the EBL opening will stay. The rest will get washed off with acetone along with the PMMA similar to the conventional lift-off process.

To quantify the amount of cross-contamination for the transfer techniques for Direct (FIG. 1(a)), Dry (FIG. 1(b)), and Litho-assisted (FIG. 1(c)) (as well as for the present invention), we optically measure the sum of all undesired transferred flakes ($A_{access}$) in a certain predefined chip area ($A_{box}$). Here, $A_{box}$ is a multiple (f=100×, 400×, and 900×) of the flake area ($A_{flake}$) in order to account for varying flake sizes (i.e. $A_{box}$=f×$A_{flake}$). Then the cross-contamination is obtained via $$CC = \left(\frac{\sum A_{access}}{A_{box}}\right)_f \quad (1)$$

Repeating the transfer experiment for each method 10 times, we can fit the resulting distributions with a Gaussian function, since each experiment is an independent sample. The resulting mean values ($\bar{\mu}$) and standard deviations ($\sigma$) from the fitting show that the spatial cross-contamination spread is most significant when considering small areas around the target transferred flake (i.e. $A_{box}$=100×) (FIG. 3(d)). This can be understood by the spatial distribution of the 2D source use for the transfer method; the repeated mechanical stamping (often manual pressing) on a similar location using scotch-tape during exfoliation leads to clustering of 2D materials. Thus, both the Direct and the Dry transfer methods (FIGS. 1(a), (b)) show an anticipated CC improvement with larger $A_{box}$, highlighting the 'edge' of the cluster area.

We briefly summarize the conceptual methodology of the Direct, and Dry transfer methods to provide a holistic picture of the steps involved in each. The Direct transfer approach (FIG. 1(a)) involves using mechanical exfoliation techniques using adhesive tape (Scotch or Nitto) and then, we bring scotch tape with the exfoliated flakes in direct contact with the substrate FIG. 1(a). [28] This approach is quick; however, there is no alignment to place a flake on a target area to the substrate.

In the Dry Transfer approach (FIG. 1(b)), [29] an intermediate polymer PDMS gel is used instead of directly placing the same scotch tape with exfoliated flakes onto the substrate. Afterwards, we place the tape in direct contact with the PDMS gel and peel off the tape rapidly. The flakes adhered to the gel and the gel was placed onto a glass slide. On the other hand, the glass slide with the gel was attached to the three-axis micromanipulator stage and placed near a three-axis micromanipulator stage holding the substrate as shown in FIG. 1(b). Since the PDMS gel is transparent, the axis of micromanipulators of the desired flake can be directly placed over the target area on the substrate of our choice easily using a microscope. This transfer method relies on the viscoelastic properties of the PDMS stamp where the gel is peeled off slowly from the substrate. This allows the flakes to adhere to the substrate rather than the gel because the strength of adhesion is dependent on the speed at which the gel is pulled. [29], [33] This transfer method is advantageous because a flake can be precisely placed; however, it is not ideal considering that not only the desired flake will be transferred since the flat core slide is pressed onto the substrate in its entirety. Thus, a non-finite probability exists that some other flakes are transferred FIG. 2(b). In dry transfer and the direct transfer, we basically create the imprint of the source. Theoretically, dry transfer can also lead to cross-contamination free transfer if we have a single flake source however in reality scotch tape exfoliation results in flake clustering, which makes it difficult to find an isolated flake.

In order to decrease this random cross-contamination further, the third transfer method, i.e. Litho-Assisted approach (FIG. 1(c)) has been tested. Here, the transfer method requires the substrates to be coated with polymethylmethacrylate (PMMA) and an opening developed on a desired location using electron beam lithography (EBL) as shown in FIG. 1(c). Theoretically, after the flakes have been transferred, flakes will remain inside the target area within the box as well as randomly distributed on top of the PMMA. Upon washing off the PMMA (i.e. Acetone rinse) the access 2D flakes residing on the polymer are taking off as well, and thus this step resembles a lift-off process.

Next, we quantitatively compare the cross-contamination (CC) of the different transfer approaches in FIGS. 2(a)-(c). The highest amount of cross-contamination is for the Direct transfer as there is no controlled placement used (e.g. $\bar{\mu}$=50%, f=100×), FIGS. 2(a), 3(d). In addition, we observe a wide distribution in the cross-contamination histogram signifying the randomness of this approach (standard deviation=$\sigma$=35° %). This method also leaves much residue from the tape on the substrate, which is undesired. However, the Dry Transfer method shows a narrower distribution (e.g. $\bar{\mu}$=28%, $\sigma$=8%, f=100×), FIGS. 2(b), 3(d), due to the ability to select a region of the PDMS/cover slide. In addition, since the entire centimeter-large cover slide touches the substrate, a non-finite probability exist that other structures or sensitive device regions are either contaminated or physically damaged during the transfer.

In contrast, we observe a significant improvement when using the PMMA coated substrate with electron beam lithography (EBL) pre-transfer fabricated openings (i.e. Litho-Assisted method) in FIG. 2(c). This ensures that any unwanted flakes on the gel are not transferred to the substrate directly as blocked by the PMMA coating. Although varying amounts of cross-contamination persist, this process is an improvement over the dry transfer by a factor of 15 defined as the FIGS. 2(c), 3(d). For areas larger than 100× of the flake area, the cross-contamination improves by a factor 22 shown in FIG. 3(d). This method is an improvement over the Dry transfer method due to the PMMA greatly reducing the cross-contamination.

Nonetheless, this method is not holistically viable since PMMA could damage a chemically-sensitive device. Additionally, trying to stamp on multiple openings on the same device poses a problem because there is a chance that flakes will transfer in adjacent openings rather than only the desired opening.

Thus, FIG. 2 shows the quantitative data and analysis of the cross-contamination (CC, see Eqn. (1)) on the substrate for each transfer method. In order to normalize our approach for varying 2D flake sizes, for each of the four transfer options investigated our methodology is as follow; (i) the size of the flake that is transferred into the target area ($A_{flake}$) is measured, (ii) the area box ($A_{box}$) in which cross-contamination is measured is taken as factors (f=100×, 400×, and 900×) times that of the transferred flake area (i.e. $A_{box}$=f×$A_{flake}$), and (iii) 10 flakes are transferred for each of the four transfer methods and a histogram is created along with a representative optical microscope image FIGS. 2(a)-2(c) (and for FIG. 3(c)). FIG. 3(d) shows fitting the CC histograms with a normal distribution we obtain the mean (data point) and standard deviation (error bar) for all four methods. The shaded region corresponds to the three selected factors, f. Our results show that for small areas near the transferred flake (e.g. f=100×) the cross-contamination is about 30% and more than 50% for the Dry and Direct methods, respectively. In contrast CC is vanishing for the 2D Printer method and independent of $A_{box}$. The decline in CC (including its error) for the Direct and Dry methods is understood as a result of spatial-clustering introduced when obtaining a 2D material PDMS source (e.g. exfoliation was used).

SUMMARY OF THE INVENTION

The invention provides a 2D printer (2D Printer). A micro-stamper is used to pinpoint the exact location the flake is to be transferred onto the substrate. A PDMS gel is placed directly over the substrate at a distance and only the part with the flake comes into contact with the substrate by bringing the micro-stamper down to transfer the desired flake within the targeted area.

Thus, a PDMS gel is stretched over the substrate and a flake is lined up with the target area. A micro-stamper is used to bend the PDMS to push the flake underneath onto the target area. This gives the same alignment precision as the Dry transfer, which determined by the overlay accuracy of the micro-stamper, 2D material and substrate. Only one single flake is transferred exactly to the target area. Using an intermediate polymer (PDMS) along with a micro-stamper pertain to a significantly reduced cross-contamination rate.

The 2D Printer reduces cross-contamination most significantly in FIGS. 3(c), 3(d). This method shows a virtually cross-contamination-free transfer by two orders of magnitude from the Dry transfer in FIG. 3(c). This is surprising as we expect the spatial accuracy for the Litho-assisted and micro-stamper-based 2D printer method to be similar.

Thus, a novel system and method is provided to transfer a precisely placed 2D material onto an arbitrary substrate with vanishing (<99%) cross-contamination up to ~10's of μm which is well beyond the current state of the art transfer methods. To show the added advantages of this method, we next compare three currently used approaches, that are simple to replicate and do not involve heating to our new one; these comparisons are the Direct [28], Dry [29], and the Litho-Assisted, and our micro-stamper-based method, termed here '2D-Printer' method. Using the latter, 2D materials can be time-efficiently placed on various electronic devices using the 2D material printer within a virtually zero cross-contamination range. We describe methodology on to industrialize the printer with rapid optical identification technique [30]-[32] and machine learning to increase scalability for various practical applications.

Here, we demonstrate a novel method of transferring 2D materials resembling the functionality known from printing; utilizing a combination of a sharp micro-stamper and viscoelastic polymer, we show precise placement of individual 2D materials resulting in vanishing cross-contamination to the substrate. The present invention 2D printer-method results in an aerial cross-contamination improvement of two to three orders of magnitude relative to state-of-the-art transfer methods from a source of average area for single flake (~50 μm2). Moreover, we find that the 2D material quality is preserved in this transfer method. For the 2D material printer on taped-out integrated Silicon photonic chips, the micro-stamper stamping transfer does not physically harm the underneath Silicon nanophotonic structures such as waveguides or micro-ring resonators receiving the 2D material. We further demonstrate functional devices such as Graphene tunnel junctions and transistors, and TMD-based material tunable microring resonators. Such accurate and substrate-benign transfer method for 2D materials could be industrialized for rapid device prototyping due to its high time-reduction, accuracy, and contamination-free process.

The 2D printer technique overcomes the issues with the prior art techniques of FIG. 1. Upfront, without the need for a PMMA substrate coating, it encompasses the full range of devices as well as a reduction in cross-contamination. For instance, the mean ratio of the 2D printer vs. Direct and Dry methods for the smallest test region are 310 and 170 respectively. The randomness of the latter two methods is somewhat mitigated when the box is increased, which can be explained by a 2D materials source (PDMS) clustering effect from originated from exfoliation. Thus, this is not intrinsic to the 2D Printer method, and would be e.g. higher if CVD grown patches of 2D material flakes would be used as a source instead.

For Device fabrications, Ti (10 nm)/Au (40 nm) contact pads with different Channel length were fabricated using Electron beam lithography and E-beam evaporator on $Si/SiO_2$ (50 nm) substrate. Graphene is exfoliated using scotch tape exfoliation method and is transferred to PDMS. PDMS is observed under the microscope for different desired flake sizes to align flakes accurately for different channel widths by using 2D printer methods. This way, the entire chip can be printed rapidly without any cross-contamination.

For waveguide measurement, the propagation loss of a Si waveguide has been measured by transferring 2D layered materials (hBN) multiple times to demonstrate any possibility of damage caused by 2D printer method. Light from a Tunable laser source (Agilent 81950A) is injected into the grating coupler on the TM mode for the waveguide. The light output from the chip is coupled to the output fiber by a grating coupler, and detected by the photo-receiver after each transfer.

These and other objects of the invention, as well as many of the intended advantages thereof, will become more readily apparent when reference is made to the following description, taken in conjunction with the accompanying drawings.

BRIEF DESCRIPTION OF THE FIGURES

FIG. 1(a) illustrates a prior art Direct transfer technique;
FIG. 1(b) illustrates a prior art Dry transfer technique;
FIG. 1(c) illustrates a Lithography assisted transfer technique;
FIG. 2(a) is a graph and picture showing the transferred flakes for the Direct technique of FIG. 1(a);
FIG. 2(b) is a graph and picture showing the transferred flakes for the Dry technique of FIG. 1(b);
FIG. 2(c) is a graph and picture showing the transferred flakes for the Lithography technique of FIG. 1(c)

FIG. 8(c) is a graph showing typical I-V characteristics of graphene/Al2O3/graphene tunnel junction;

FIG. 8(d) is transfer a flake onto a ring resonator according to the prior art Direct Transfer technique;

DETAILED DESCRIPTION OF THE PREFERRED EMBODIMENTS

Figure 3A:
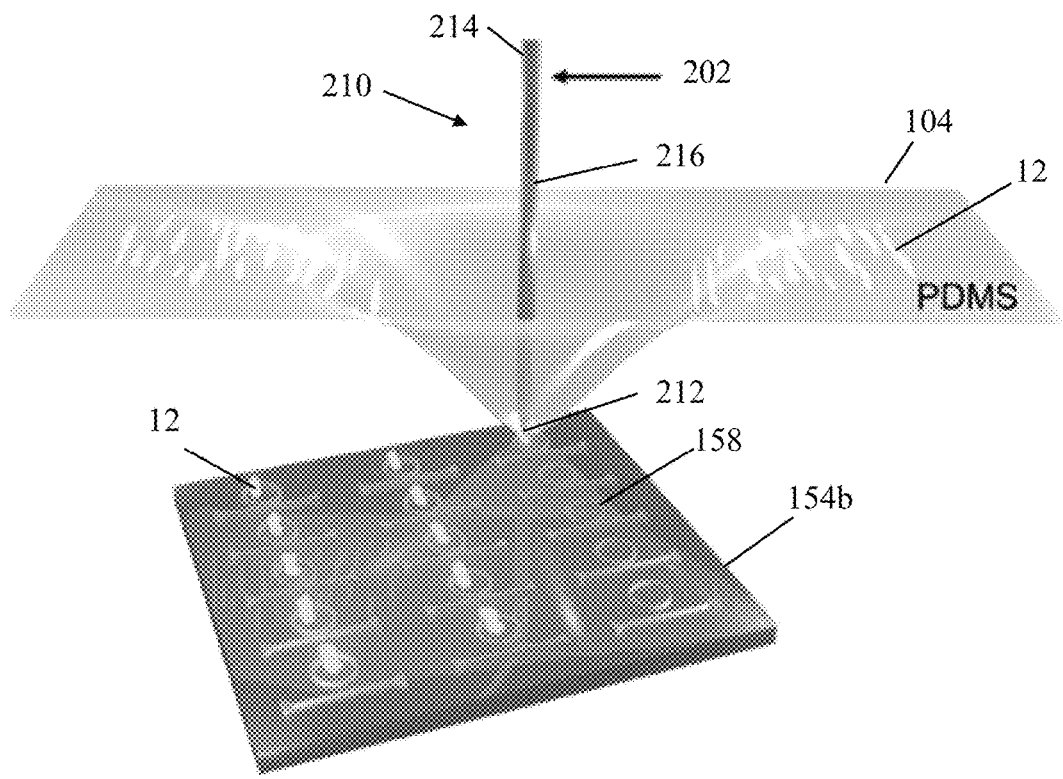
FIG. 3(a) shows a 2D Printer stamper in accordance with one embodiment of the invention.

In describing the illustrative, non-limiting preferred embodiments of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

Figure 3B:
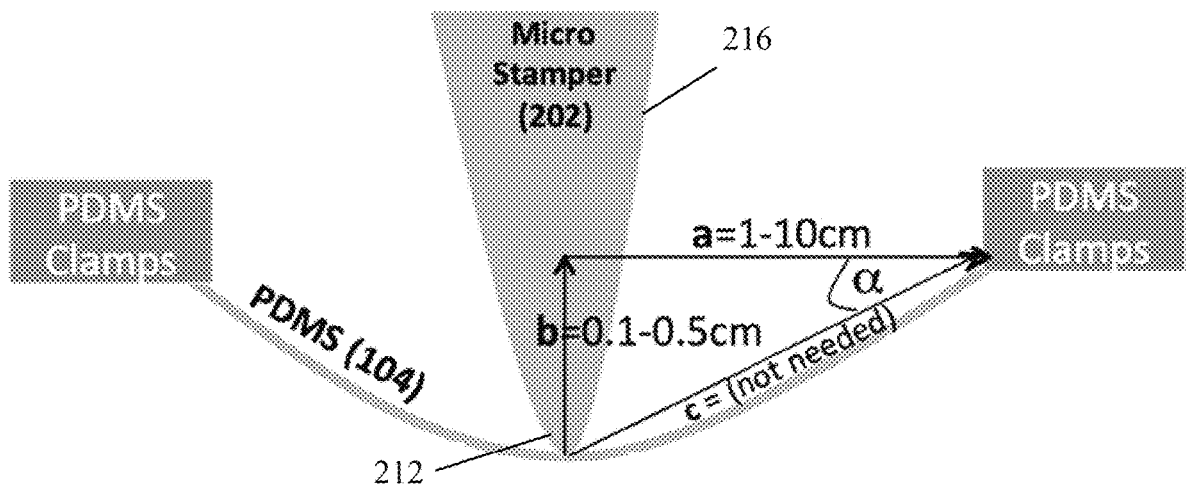
FIG. 3(b) is a detailed view of the distal end of the stamper and the transfer material.
Figure 3C:
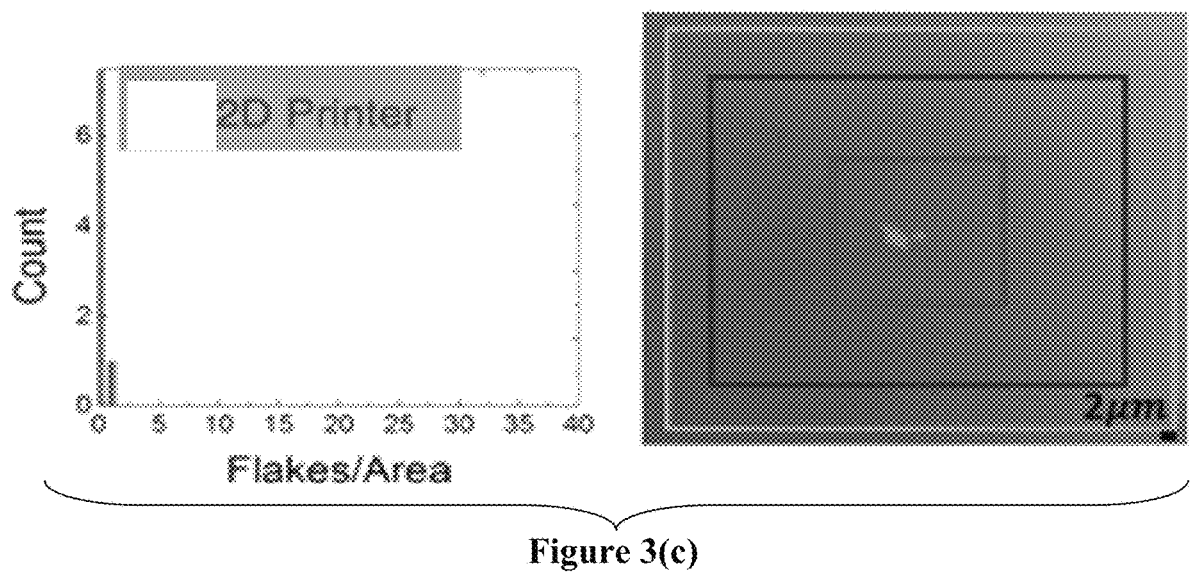
FIG. 3(c) is a graph and picture showing the transferred flakes for the 2D Printer of FIG. 3(c)
Figure 3D:
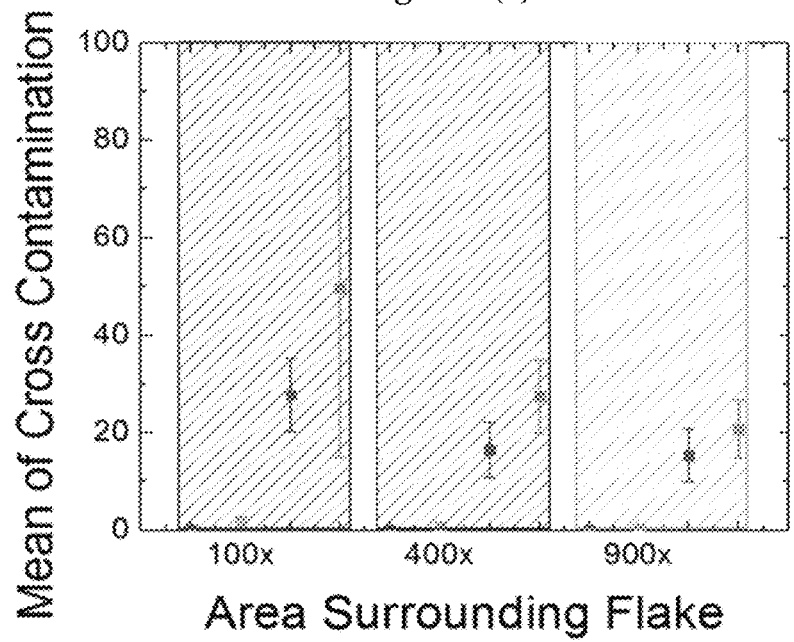
FIG. 3(d) is a graph comparing the prior art and invention contamination.
Figure 4:
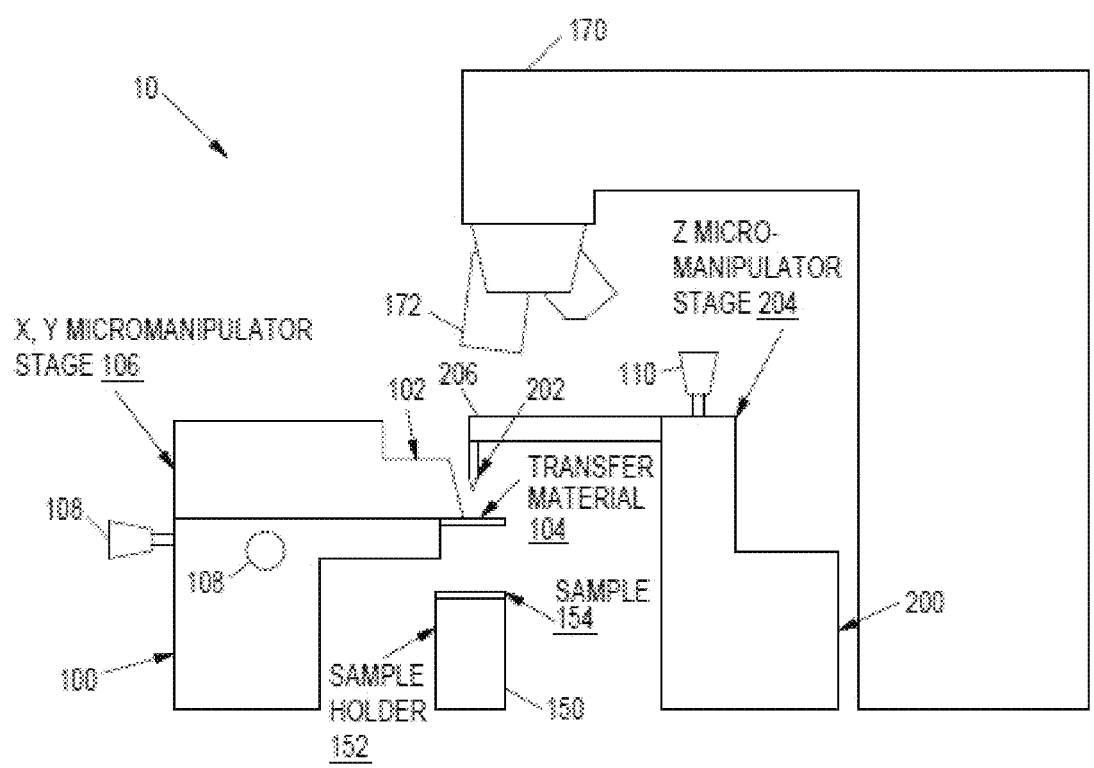
FIG. 4 is a system of the 2D printer.

Referring to FIGS. 3(a), 3(b), 4, the two-dimensional printing system 10 is shown in accordance with a non-limiting example of the invention. Turning first to FIG. 4, the system 10 includes a transfer apparatus 100 such as PDMS apparatus, a sample apparatus 150, an imaging device 170 such as an automated or manual microscope, and a stamping apparatus 200. The sample apparatus 150 has a sample holder 152 that holds or retains one or more samples 154. The sample 154 can be, for example, a transferring substrate 154a having target 2-dimensional (2D) material to be transferred. Here, the term 2D material is generally used to refer to flakes, 2-dimensional material films, or multiple layered materials, or hetero-layers comprised of such 2D films (partial portions of those films 'flakes' or the entirety of the film). The sample 154 can also be, for example, a receiving substrate 154b to which the target flakes are to be placed or received in a target area 158. The sample holder 152 can hold both the transferring substrate 154a and the receiving substrate 154b, or separate sample apparatus 150 can be provided, one for the transfer substrate 154a and one for the receiving substrate 154b.

The sample apparatus 150 can also include a positioner such as a micromanipulator 156 that is coupled to and moves the sample holder 152 so that either the transferring sample or the receiving sample is aligned with the transferring apparatus 100 and the stamping apparatus 200. For example, the manipulator can be a conveyor belt that moves in a single direction, or a plate that moves in both x- and y-directions. The sample can have any suitable size and shape, such as for example a square or a rectangle up to 10 inches. In one embodiment, the sample 154 is flat and has a flat top surface that forms a plane that is substantially horizontal.

The transferring apparatus 100 includes a transfer material holder 102 that holds or retains a transfer material 104, and a positioner such as a micromanipulator 106. The transfer apparatus 100 can also include a micromanipulator stage 106 that is coupled to the holder 102. The micromanipulator 106 can move the transfer material 104 in an x- and y-direction to align with the microscope 170, stamper assembly 200 and/or sample apparatus 150. As shown, the transfer material 104 is positioned between the sample 154 and the transfer-stamper 202 of the stamping apparatus 200. The transfer-stamper 202 can be, for example, a micro-stamper or a macro-stamper, or other transfer mechanism, but is generally referred to below as a micro-stamper.

The transfer material 104 is suitable to transfer (pick up and release) a flake to which the transfer material 104 is pressed. In one non-limiting example embodiment of the invention, the transfer material 104 can be a PDMS gel. The thicker the transfer material 104, the lower the transfer resolution, but the more stable. The transfer material 104 can have any suitable size and shape, such as for example a square or a rectangle. The transfer material 104 has a resting position (FIG. 4) which in one embodiment is flat and lies in a plane that is substantially parallel to the plane of the sample material 154, both of which are substantially horizontal in the embodiments of FIGS. 3(a), 4. The transfer material 104 is aligned with the sample 154 is and spaced apart from the sample 154 by a distance of approximately 1-5 mm, though other suitable distances can be utilized. The lower the distance, than the transfer material will be able to more reliably transfer the flake, but this could result in a wider surface-contact which could impact cleanness of the transfer especially if the transfer substrate is dense with flakes. In one example embodiment, for 10 um and greater close transfers, a 1 mm distance can be used.

The microscope 170 has a long distance working objective 172. The microscope 170 enables a user or machine to view the flakes on the sample or substrate 154, and also to align the transfer material 104 and micro-stamper 202 with the target (flake to be transferred and/or the desired position for the flakes) on the sample 154. As shown in FIG. 4, the microscope objective 172 is positioned above and aligned with the micro-stamper 202, which in turn is positioned above and aligned with the transfer material 104, which in turn is positioned above and aligned with the sample 154.

The stamping apparatus 200 includes a micro-stamper 202, a positioner such as a micromanipulator stage 204, and an arm 206. As best shown in FIG. 3(a), the micro-stamper 202 is an elongated rod having a body 210 with a distal end 212, proximal end 214 and an intermediate portion 216. The proximal end 214 and the intermediate portion 216 can have any suitable cross-sectional shape such as a circle, square or rectangle. The stamper 202 is sufficiently long so that it can be extended from the support arm 206, to the transfer material 104 and depress the transfer material 104 to extend to touch the top surface of the sample 154. The distal end 212 of the stamper 202 refers to the extreme end face of the stamper body 210, and can also be referred to here as the distal end face 212. The distal end 212 can have any suitable shape for its cross-section and the extreme end face, though in one embodiment is circular, oval, or rectangular. In one embodiment of the invention, the distal end 212 is completely flat and void of any bumps or projections, so that the distal end 212 causes the transfer material 104 to reliably contact the entirety of the flake 12 to be transferred. The distal end is slightly larger than the flakes to be transferred by the transfer material 104, and in one embodiment has a size of few (2-10 um) to 100-300 um, though can be larger (on the order of millimeters or centimeters) for large films. The size of the distal end can depend on the distance that the transfer material must move, so that the stamper does not punch through the transfer material. In yet another example embodiment of the invention, the edges of the distal end can be curved (FIG. 3(b)) so that avoid puncturing the PDMS material 104.

As further illustrated in FIGS. 3(a), 4, the stamper 202 has a longitudinal axis that is substantially orthogonal to the plane of the transfer material 104 and the plane of the sample 154. And the support arm 206 is an elongated member that extends outward from the micromanipulator stage 204 and connects to the micro-stamper 202. The support arm 206 can be part of the micromanipulator stage 204. The stamp micromanipulator stage 204 moves the support arm 206 in a z-direction to position the micro-stamper 202 with respect to the transfer material 104 and substrate 154. Thus, the micromanipulator stage 204 can also raise and lower the support arm 206 to move the micro-stamper 202 toward and away from the transfer material 104 and sample 154 (up/down in the embodiment of FIGS. 3(a) and 4. Thus, even if the stamper 202 is not elongated and does not have a longitudinal axis, the stamper 202 moves in a direction that is substantially orthogonal to the plane of the transfer material 104 and the plane of the sample 154. In one example embodiment, the micro-stamper 202 can be raised and lowered manually by use of a knob 110, or can be controlled automatically, such as by a motor.

Thus, the 2D printer has a two-axis (x- and y-directions) stage micromanipulator 106 holding the PDMS holder 102 in FIG. 4, which in turn holds the PDMS material 104. The PDMS holder 102 can be controlled manually by use of knobs 108, or can be controlled automatically, such as by a motor. The manipulator 106 can be three-axis (x-, y-, and z-directions) to raise and lower the PDMS holder 102 before and/or after transfer of the flake. The micromanipulator holds clips responsible for holding the thin transfer material 104, which can be a PDMS gel. Another three-axis (x-, y- and z-directions) micromanipulator 204 is used to control the micro-stamper. And a three-axis (x-, y-, and rotation) micromanipulator 156 can be utilized to move the sample 154. The manipulator 156 can also move up/down, if needed before and/or after the flake transfer.

As described, micromanipulators 156, 106, 204 are utilized because the micro-stamper placement must be very precise since a slight shift of a few micrometers could drastically change the flake alignment. Thus, the manipulators can perhaps be adjusted to less than 10 nm so that the flakes can be transferred with that accuracy, though up to 10 micrometers adjustment can also be provided. While improved equipment such as high magnification microscope objective lenses with (ideally) long working distance and nanometer or micrometer precision mechanical components yield better overlap accuracy, the setup used in this work has a lateral transfer resolution of about ±5 µm, mainly limited by mechanical precision and optical resolution. The latter sets a bound given by the long-required working distance of the objective lens. In addition, it is necessary to consider the size of the flake being transferred. If a flake is smaller than the micro-stamper 202, the flake will transfer 100% of the time because the entire surface area of the flake touches the substrate. On the other hand, if a flake is larger than the micro-stamper 202, the flake will not transfer reliably. In this case, either a part of large flake will transfer or there will be no transfer at all due to the multilayer nature.

Figure 5:
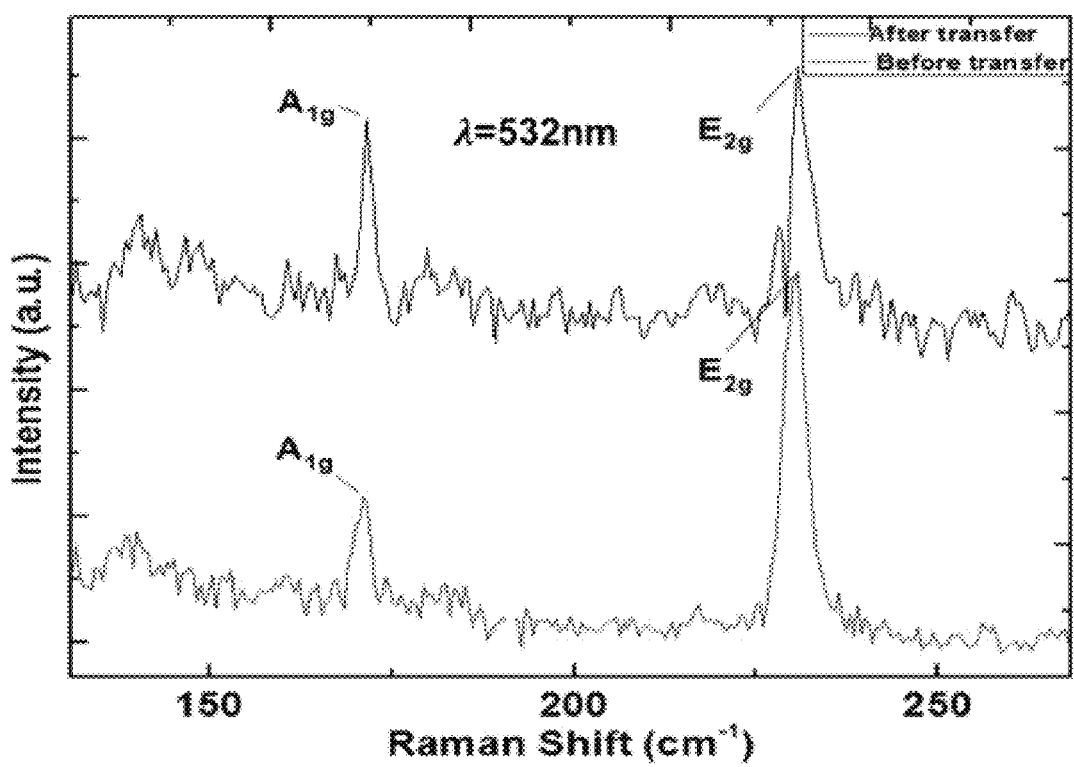
FIG. 5 is a Raman spectroscopy graph of before and after transfer.
Figure 6:
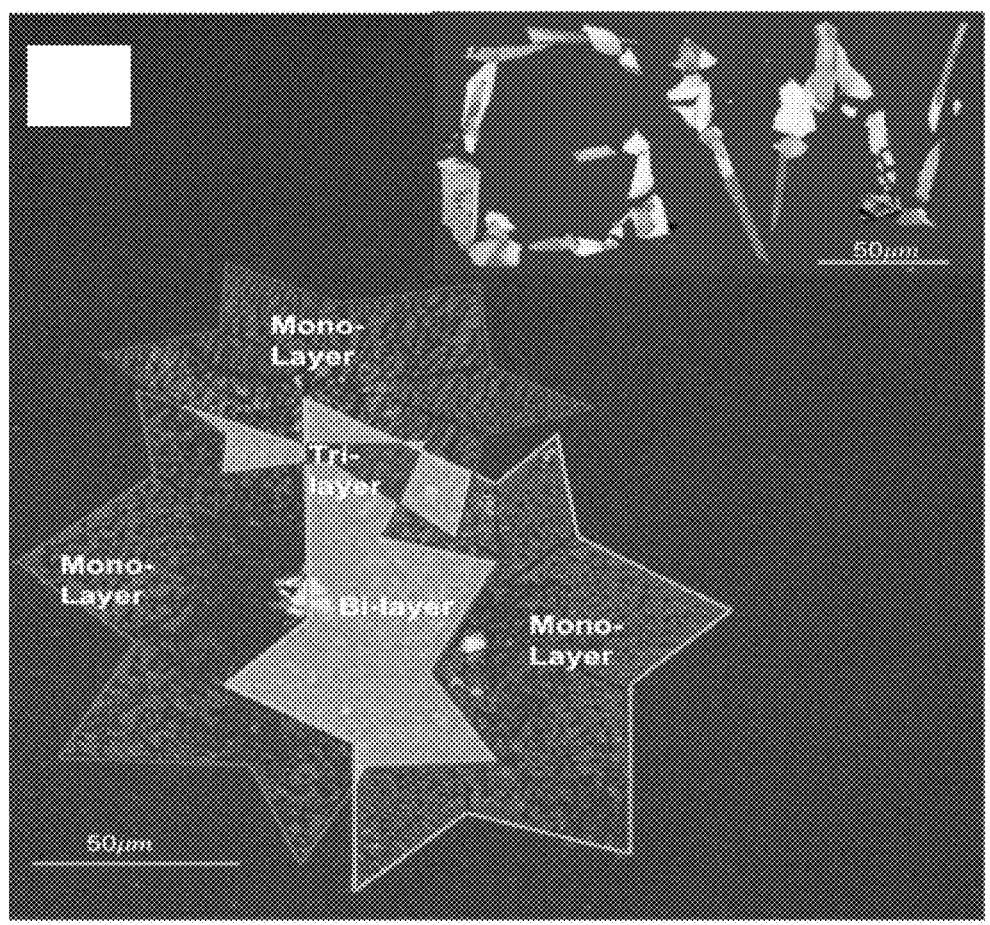
FIG. 6 shows accurate placement of flakes.
Figure 7:
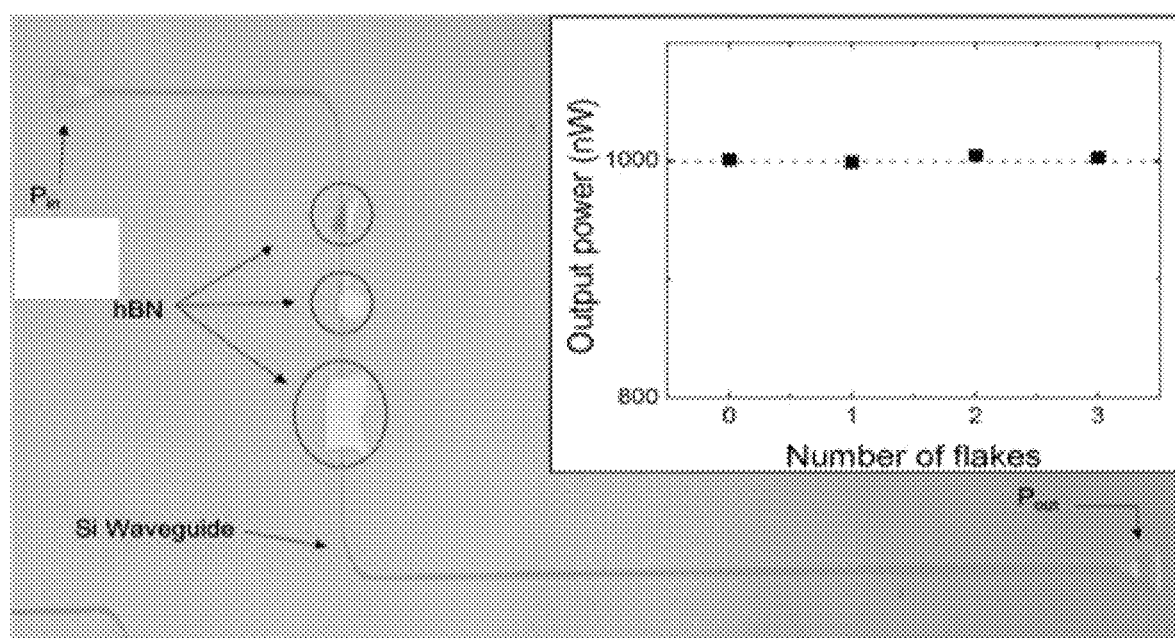
FIG. 7 shows another result of the 2D Printer.

Since the micro-stamper 202 and the PDMS 104 are key factors in reducing cross-contamination, testing is further done to ensure accuracy when the experiment is reproduced, we find that when the micro-stamper is in contact with the substrate, the PDMS acts as a shock absorber, preventing any possible damage to the device. Raman measurements have been performed to investigate the quality of the 2D flakes before and after the transfer process as depicted in FIG. 5. Looking at the spectra for both before and after transfer, the peaks rise ($A_{1g}$=171.11, $E_{1g}$=230.64) at the same point ensuring that the material's identity has not been affected in this transfer process. We have demonstrated thickness controlled transfer process by using our method as presented in FIG. 6. Three monolayers flakes have been transferred successively on top of each other with precise alignment providing immense opportunity in terms of device functionality as discussed later. Due to the precision placement and cross-contamination-free essence of this method, it can be applied for the creation of multiple, quick and accurate heterostructures on the same chip. FIG. 7 presents the integration of h-BN on Si waveguide by our 2D printer method to demonstrate damage-free transfer. That is, we have transferred several h-BN layers on a Silicon waveguide multiple times and measured the propagation loss after each transfer (see inset to FIG. 7). The measured waveguide output power remains unchanged, just limited by the noise.

Referring to FIGS. 4-7, a schematic of the 2D printer is illustrated (FIG. 4) and described along with a Raman spectroscopy graph (FIG. 5) of the flake before and after the transfer process. FIG. 4 is a schematic diagram of the 2D printer. The setup of the 2D printer includes a micromanipulator stage 156 that rotates to align with the specific geometry of the flake as needed. The PDMS gel 104 is held above the substrate 154 with the PDMS clipped together on both sides, as shown by the clamps in FIG. 3(b). The gel 104 is stretched out until it is taut to increase the likelihood of transferring a single flake.

A micro-stamper 202 is placed over the gel 104 with an adjustable three-axis micromanipulator 204. Referring to FIG. 5, a Raman spectroscopy graph of before and after the 2D Printer transfer of a TMD flake (MvoTe2) shows the preservation of the material quality upon micro stamping using the 2D Printer 10. FIG. 6 shows the accurate placement of three monolayers of TMDs sample showing the versatility of the 2D printer 10. Printing of the letters "GW" using 2D materials demonstrates the precise alignment of flakes (see inset of FIG. 6). FIG. 7 is a demonstration of hybrid integration of three hBN being transferred onto a silicon photonic waveguide using the 2D Printer 10 showing an unchanged power output of the waveguide. This indicates that placing the 2D materials onto waveguides is a gentle method that minimizes contamination.

The advantages of the 2D material printer 10 are highlighted in FIG. 8 showing various practical applications. For instance, we demonstrate the capability to successfully transfer graphene on a dense array (5×2) of transistors on a silicon substrate (FIG. 8(a)). Here we find little to no cross-contamination on the device, providing the ability to have multiple stampings on the same substrate to create working devices. This is not possible with the dry transfer method for typical dense flake sources. The transfer characteristics of graphene FET devices based on this method show functional FET (FIG. 8(b)). The Dirac point obtained from the IV-curve is about 1.5 V, which suggests p-type doping anticipated from oxygen doping in ambient conditions.

FIG. 8 shows applications based demonstration of the novel 2D Printer transfer method. In FIG. 8(a), a 5×2 dense array of graphene FETs is shown on slot waveguides using the 2D Printer 10. The flakes are placed inside the boxes with no observable zero cross-contamination. Towards realizing integrated electronic or photonic devices or heterostructures can be built in this fashion as demonstrated. In FIG. 8(b), transfer characteristics are shown of the field effect transistor channeled by monolayer graphene (GFET) sweeping gate voltage (Vg) from −20 to +20 V under ambient condition at VSD=20 mV showing ambipolar nature with a Dirac point @ 1.5 V suggesting slightly p-type doped. A schematic is shown of the single back gated GFET (see inset to FIG. 8(b)).

Referring to FIG. 8(c), typical I-V characteristics of graphene/Al2O3/graphene tunnel junction showing negative differential resistance (NDR) effect. A device schematic is shown in the inset. In FIG. 8(d), the Direct transfer method (FIG. 1(a)) is used to transfer a flake onto a ring resonator. However, the lack of selectivity of this method transfers more than the target flake, depending on the source quality. If exfoliation is used as a source, the to-be-stamped PDMS usually contains clusters of 2D materials leading to a high amount of cross-contamination potentially ruining neighboring devices or waveguides. On sensitive and costly chips (e.g. such as on tape-outs as done here using silicon photonics), this method would not be viable considering the amount of cross-contamination that is unpreventable as well as the randomized approach to get a flake 12 onto the target area 158.

Figure 8A:
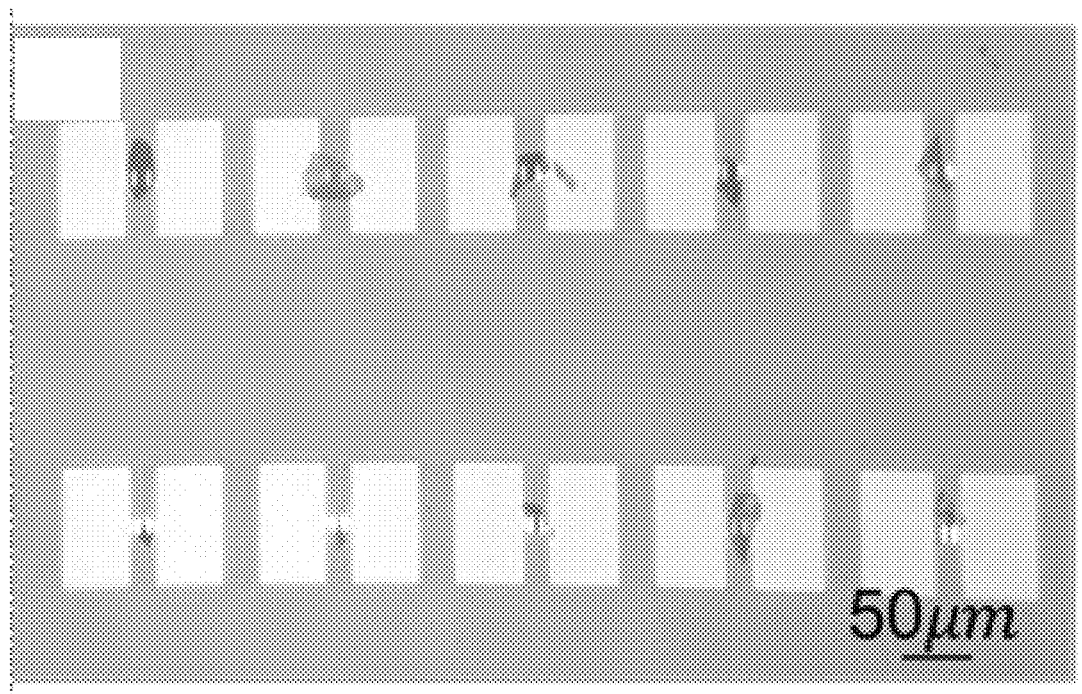
FIG. 8(a) shows a 5×2 dense array of graphene FETs is shown on slot waveguides.
Figure 8B:
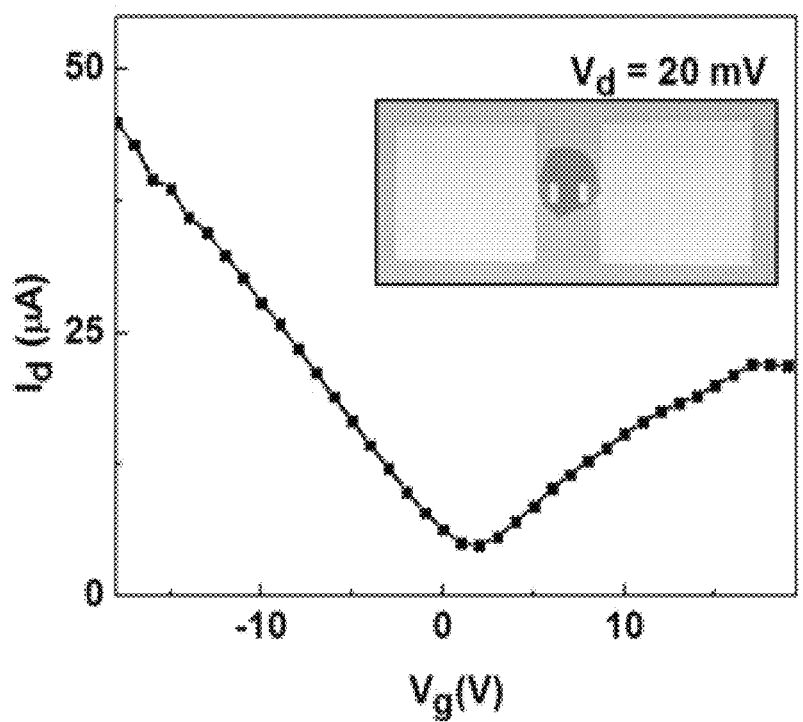
FIG. 8(b) is a graph showing transfer characteristics.
Figure 8E:
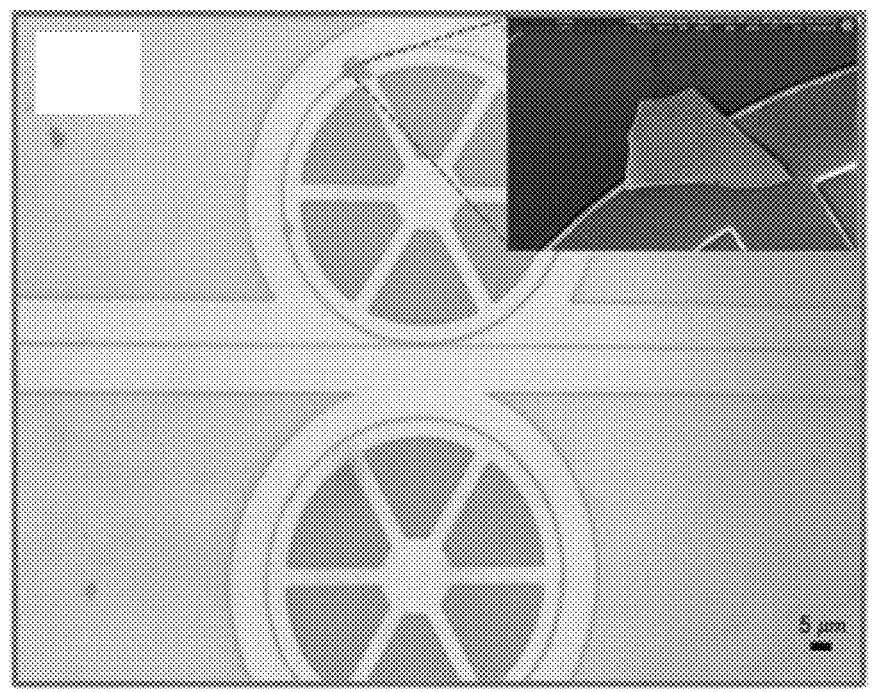
FIG. 8(e) shows the precise transfer of a single flake onto a ring resonator in accordance with the present invention.
Figure 8F:
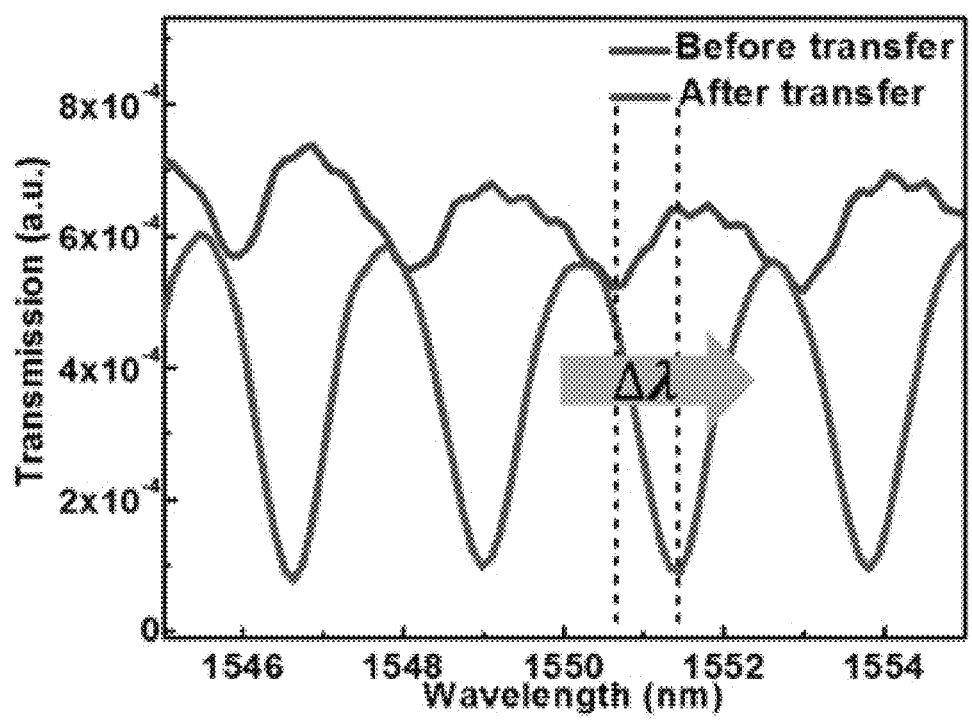
FIG. 8(f) is a graph showing the transmission spectrum with resonance shift after transfer of TMDCs.

In FIG. 8(e), the 2D Printer 10 is used to precisely transfer a single flake onto a ring resonator. The optical microscope image shows that the flake is successfully transferred onto a single micro ring resonator with no cross-contamination. The inset shows the SEM image of the transferred flake on the micro-ring ring resonator. FIG. 8(f) shows the transmission spectrum with resonance shift after transfer of TMDCs on top of Si micro-ring resonator resulting a change in effective refractive index of the propagated mode.

The invention successfully demonstrates functional devices using the 2D printer 10 by fabricating multiple heterostructures. The invention provides an accurate yet fast 2D printer based transfer approach. We tested this capability by fabricating Graphene-based transistor devices whose $I_d$-$V_d$ characteristics of these graphene/oxide/graphene tunnel junctions (FIG. 8, 4(c)). Indeed we observe the characteristic negative-resistance behavior where the two graphene Fermi-levels facilitate electron tunneling. The precise and dense transfer functionality of the 2D printer is further exemplified by enabling heterogeneous integration of 2D materials with silicon photonics (FIGS. 8(d), (e)). We place a MoTe$_2$ flake onto a Si micro-ring resonator to tune its relative phase and coupling condition by changing the optical mode of the ring. We find a high-degree of cross-contamination for the Dry method (FIG. 1(a)) with flakes scattered across the silicon photonic waveguides, covering neighboring devices. This renders this method unusable for taped out Si-photonic chips.

Repeating the experiment with the 2D Printer 10 shows that only the single targeted flake is accurately placed onto the micro-ring resonator. The optical transmission before and after transfer of TMDCs shows a significant resonance shift (FIG. 8(f)). This provides an improvement of coupling and right shift (FIG. 8(f)) of resonance after the transfer of MoTe$_2$ layer on top of the resonator. This can be explained by a relative coupling shift (from bus to the ring) of this hybrid device towards critical coupling (r=a, where r is the self-coupling coefficient and a is the roundtrip transmission coefficient) as compared to before transferring which is over coupled (a>r). The resonance condition of the ring is given by, $$\lambda_m = \frac{2\pi R * n_{eff}}{m}$$

where, $\lambda_m$ resonant wavelength, m is the mode number, R is the radius of the ring and $n_{eff}$ is the effective refractive index. From the above equation, we can obtain the following formula, $$\frac{\Delta\lambda_m}{\lambda_m} = \frac{\Delta n_{eff}}{n_{eff}}$$

suggesting the redshift of resonance ($\Delta\lambda_m$) occurs due to the increase of effective refractive index ($\Delta n_{eff}$) after the transfer of MoTe$_2$ layer as indicated in FIG. 8(f).

Industrial application for Van der Waals heterostructures requires a scalable approach to stack 2D materials on top of each other and an arbitrary substrate with any morphology. The 2D Printer 10 is reliable and can be automated without any manual operation. The apparatus in FIG. 4 could be automated with a motor using a microcontroller or Raspberry Pi to rotate both stages according to user input, effectively reducing human error of misalignment. One of the major characteristics of these exfoliated flakes is a correlation between the color of the flakes taken with an optical white light microscope images versus the heights of the flakes. [30]-[32] AFM height measurement data will be taken and fed into a machine-learning algorithm to determine flake heights that were not explicitly determined. The color contrast will be calculated, and a data spreadsheet will be created corresponding the color and height variables. A user interface will ask for desired 2D material, desired flake height, desired flake size, and target area 158 for input. Such rapid optical identification algorithm make it possible to quickly locate the desired characteristics and align the two micromanipulator stages and the micro-stamper will be brought down automatically. This creates an industrial style quick, efficient, and low cross-contamination 2D material printer for use of placing 2D materials on optoelectronic devices, photonic integrated circuits, etc.

In summary, a novel transfer 2D printer 10 utilizes a micro-stamping technique to significantly reduce the lateral cross-contamination area on the substrate receiving the 2D material and improving spatial accuracy. Using a conventional micro-stamper significantly improves the transfer of multilayer and few layer 2D materials reliably reducing cross-contamination often caused by other transfer methods. Compared to the state of the art transfer methods, the 2D printer 10 shows a virtually cross-contamination-free (>99% clean) transfer methodology up to ~10's of μm. This capability significantly increases the range of application of 2D materials. We also demonstrate the diversity of applications that this printer 10 and technique can perform (i.e. electronics, photonics, plasmonics, on-chip circuits, etc.) as well as showing that it does not damage these devices. Additionally, this printer 10 and technique can be easily automated by combining rapid optical identification algorithms along with simple motors. The printer can be further improved by these means of automation, reducing the human error as well as improving transfer speed. This fast and efficient method will provide a means for expedited research regarding 2D materials on optoelectronic devices, heterostructure fabrication, and more.

In one non-limiting example of the invention, the automated printer 10 can include an imaging device 170, such as having a camera or the like, instead of a microscope 170. And the imaging device 170 can have an imaging micromanipulator. Still further, one or more controllers or processing devices can be provided in communication with the imaging device 170, stamping apparatus 200, sample apparatus 150, and/or PDMS apparatus 100. The processing device can communicate with the imaging micromanipulator, stamping micromanipulator 204, PDMS micromanipulator 106 and/or the sample micro-manipulator 156 and provide respective control signals to automatically position the imaging device 170, micro-stamper 202, the PDMS material 104, and/or the sample(s) 154 to be in alignment with one another.

In an alternative embodiment, the system need only know where to place. For example, the system can utilize a CAD file with coordinates, and not use an imaging system, provided that the x, y controller and driver are closed-loop and know exactly how far they have traveled relative to an absolute coordinate system. Thus, an automated system may not necessarily need to have an imaging device, but instead can use a CAD file or have data indicating the location of the flakes. The system would have a registration system, which can include optical registration, but could also be with piezo devices in closed loop form, other otherwise.

The operation of the system 10 will now be discussed with respect to FIGS. 3(a), 4. The transfer substrate having the flake 12 to be transferred, is placed in the sample holder 152. And the transfer material (i.e., PDMS) 104 is placed in the PDMS holder 102. The imaging device 170 is then used to align the micro-stamper 202 with the PDMS 104 and the target flake 12 on the transfer substrate 154a. Since the PDMS material 104 is optically transparent, the imaging device 170 is able to optically image the micro-stamper 202 and the transfer substrate 154a, and therefore is aware of the position of the micro-stamper 202, the target flake 12, and the transfer substrate 154a (the system is aware of the location of the photonics devices on the substrate).

If necessary, the controller (i.e., processing device) sends a control signal to any of the sample or substrate micromanipulator 156, the stamper micromanipulator 204, and/or the transfer micromanipulator 106 to respectively move any one or more of the sample holder 152 (which in turn moves the transfer substrate 154a), the micro-stamper 202 (e.g., directly or by moving the support arm 206), and/or the PDMS holder 102 (which in turn moves the PDMS material 104) so that the transfer substrate 154a, micro-stamper 202 and PDMS 104 are properly aligned with each other. In this ready position, the micro-stamper 202 is aligned over the PDMS material 104, which is aligned over the transfer substrate 154a. In one non-limiting example embodiment, the micro-stamper 202 is approximately about <1 millimeter away (vertically) from the PDMS material 104, and the PDMS material 104 is approximately 1-5 millimeter from the substrate 154.

Once the printer 10 is in the ready position with the micro-stamper 202 aligned with the PDMS material 104 and the target flake 12 on the transfer substrate 154, the controller then sends a control signal to the stamper micromanipulator 204 to move the micro-stamper 202 toward the transfer material 104 and the transfer substrate 154 (downward in the embodiment of FIG. 4). The micro-stamper 202 continues moving until it comes into contact with the PDMS material 104, which can be a very small distance. It then continues to move toward the transfer substrate 154 (downward in the embodiment of FIGS. 3(b), 4). The distal end 212 of the stamper 202 stretches the PDMS gel material 104 downward until it comes into contact with the target flake 12 on the transfer substrate 154a. That distance can be relatively small, such as for example 1-5 mm, whereby the transfer material 104 is at an angle of about 1-27 degrees, as shown in FIG. 3(b). The angle of the transfer material 104 is about the angle $\alpha$ of the right-angled triangle a, b, c in FIG. 3(b), where:

$$\tan(\alpha) = \frac{b}{a} = \frac{[0.1; 0.5]}{[1; 10]} = \text{e.g.} = [0.01; 0.5] \text{ cm}$$

and $\alpha = [0.5; 27]°$.

As the micro-stamper 202 travels, the controller continues to monitor, utilizing output from the imaging device 170, the alignment of the micro-stamper 202 with the target flake 12, and can send one or more control signals to the stamper micromanipulator 204, the PDMS micromanipulator 106 and/or the substrate micromanipulator 156 to best align the micro-stamper 202 with the PDMS material 104 and the target flake 12 on the transfer substrate 154a. Once the PDMS material 104 contacts the target flake 12, the flake 12 is transferred from the transfer substrate 154a to the transfer material 104. More specifically, when the PDMS 104 touches the substrate 154, the flake is in contact with the PDMS 104, but the surface energy between the flake and the substrate is higher than the flake and PDMS 104, so the flake leaves the PDMS 104 when the PDMS 104 is pulled up. Any desirable force can be applied and optionally dynamically measured to ensure that the flake is reliably transferred.

At this point, the printer 10 is in the transfer position, with the distal end 212 of the stamper 202 pressing the PDMS material 104 to the transfer substrate 154. The PDMS material 104 is at the furthest stretched position. Since the PDMS material 104 is stretched, the PDMS material 104 only touches the transfer substrate 154a in a very focused area of the substrate 154 defined by the size and shape of the distal end 212 of the stamper 202. Accordingly, the size and shape of the distal end 212 is selected to be only slightly larger than the size and shape of the flakes 12 to be transferred. In this manner, the printer 10 minimizes the amount of excess material that the PDMS material 104 picks up from the transfer substrate 154a and transferred to the receiving substrate 154b, thereby minimizing contamination of the receiving substrate 154b.

Accordingly at this point, the printer 10 is in the transfer position and the flake 12 has been transferred to the transfer material 104. The controller then sends a control signal to the stamper micromanipulator 104 to move the micro-stamper 202 away from the transfer substrate 154a, for example by raising (upward in the embodiment of FIG. 4) the micro-stamper 202 slightly to a hold position. The micro-stamper 202 is raised just enough to provide a gap between the distal end 212 of the stamper 202 with the transfer material 104, and the transfer substrate 154a. In an alternative embodiment, instead of moving the micro-stamper 202 upward to the hold position, the controller can instead send a control signal to the substrate micromanipulator 156 to move the transfer substrate 154 away (i.e., downward) from the micro-stamper 202.

Once the printer 10 is in the hold position, the controller then sends a control signal to the substrate micromanipulator 156 to move the transfer substrate 154a completely away from the micro-stamper 202, and to move the receiving substrate 154b into position below the micro-stamper 202. As previously noted, the transfer substrate 154a can be at the same sample apparatus 150 as the receiving substrate 154b or the transfer substrate 154*b* can be at a different sample apparatus 150 than the receiving substrate 154*b*. In this manner, the PDMS material 104 and micro-stamper 202 remain stationary so that the flake 12 does not inadvertently come free of the PDMS material 104 and the flake 12 remains aligned with the micro-stamper 202. However, in an alternative embodiment, the transfer substrate 154*a* and the receiving substrate 154*b* can remain stationary, and the controller can send a control signal to the stamper micromanipulator 204 and the PDMS micromanipulator 106 to simultaneously move the micro-stamper 202 and PDMS material 104 from alignment with the transfer substrate 154*a* to alignment with the receiving substrate 154*b*.

At this point, the printer 10 is in the set position, with the micro-stamper 202 and the stretched PDMS material 104 aligned with the target area on the receiving substrate 154*b*, but slightly retracted from the receiving substrate 154*b*. The controller then sends a control signal to the stamper micromanipulator 204 to move the micro-stamper 202 toward (downward) the receiving substrate 154*b*. Accordingly, the micro-stamper 202 moves to the placement position, where the distal end 212 of the micro-stamper 202 presses the PDMS material 104 against the target area on the receiving substrate 154*b*, as best shown in FIG. 3(*a*).

In that placement position, the PDMS material 104 is at the furthest stretched position. Since the PDMS material 104 is stretched, the PDMS material 104 only touches the receive substrate 154*b* in a very focused area of the substrate 154*b* defined by the size and shape of the distal end 212 of the stamper 202. Accordingly, the size and shape of the distal end 212 is selected to be only slightly larger than the size and shape of the flakes 12 to be transferred. In this manner, the printer 10 minimizes the amount of excess material that the PDMS material 104 picks up from the transfer substrate 154*a* and transferred to the receiving substrate 154*b*, thereby minimizing contamination of the receiving substrate 154*b*. And, the distal end 212 can position the flake 12 in a very precise target area 158 on the receive substrate 154*b*.

Once the stamper 202 touches the receive substrate 154*b*, the flake 12 is transferred to the receive substrate 154*b*. The controller then sends a control signal to the stamper micromanipulator 204 to cause the micro-stamper 202 to move away from (upward in the embodiment of FIG. 4) the receive substrate 154*b*. At this point, the printer 10 can move to the set position where the micro-stamper 202 is slightly separated from the receive substrate 154*b*, but the stamper 202 still stretches the PDMS material 104. The transfer substrate 154*a* can then again be placed below the micro-stamper 202 and the micro-stamper 202 aligned with a new target flake 12 on the transfer substrate 154*a*. That will result in the same area on the PDMS material 104 being used to acquire the new target flake 12. Or, the micro-stamper 202 can move back to the ready position shown in FIG. 4, where the micro-stamper 202 does not touch the PDMS material 104. As it moves upward, the PDMS material 104 retracts and returns to its original shape. The controller can then send a control signal to the stamper micromanipulator 204 to align the micro-stamper 202 with a different and previously-unused area on the PDMS material 104, and also align the micro-stamper 202 and PDMS material 104 with the new target flake 12 on the transfer substrate 154*a*. The process is then repeated to acquire the new target flake 12 and transfer it from the transfer substrate 154*a* to the receive substrate 154*b*.

It is noted that the invention has been described as having multiple micromanipulators, including a stamp micromanipulator 204, PDMS micromanipulator 106, and a substrate micromanipulator 156. And, that the stamp micromanipulator 204 only moves in the z-direction (up/down), whereas the PDMS micromanipulator 106 only moves in the x-direction and the y-direction. However, only one micromanipulator can be utilized and positioned at any device or location, including the imaging device 170, stamping apparatus 200, transfer apparatus 100, or substrate apparatus 150. Or, more than one micromanipulator can be utilized at any or all of those devices or locations. Moreover, the micromanipulator can be any suitable device that can cause movement in one or more directions.

The controller/processing device can be any suitable device, such as a computer, server, mainframe, processor, microprocessor, PC, tablet, smartphone, or the like. The processing devices can be used in combination with other suitable components, such as a display device (monitor, LED screen, digital screen, etc.), memory or storage device, input device (touchscreen, keyboard, pointing device such as a mouse), wireless module (for RF, Bluetooth, infrared, WiFi, etc.). The information may be stored on a computer hard drive, on a CD ROM disk or on any other appropriate data storage device, which can be located at or in communication with the processing device. The entire process is conducted automatically by the processing device, and without any manual interaction. Accordingly, unless indicated otherwise the process can occur substantially in real-time without any delays or manual action.

The operation of the processing device can further be implemented by computer software that permits the accessing of data from an electronic information source. The information may be stored on a computer hard drive, on a CD ROM disk or on any other appropriate data storage device or medium. The system can also be implemented on the cloud and comprise a cloud computing system which provide access via the Internet to shared computing resources, such as servers, storage devices, networks, and/or applications on demand or in real time without regard to the location of those resources. And a medium includes one or more non-transitory physical media that together store the contents described as being stored thereon. Embodiments may include non-volatile secondary storage, read-only memory (ROM), and/or random-access memory (RAM). And an application includes one or more computing modules, programs, processes, workloads, threads and/or a set of computing instructions executed by a computing system. Example embodiments of an application include software modules, software objects, software instances and/or other types of executable code.

It is further noted that the description uses several geometric or relational terms, such as circular, parallel, perpendicular, orthogonal, concentric, and flat. In addition, the description uses several directional or positioning terms and the like, such as top, left, right, up, down, distal, and proximal. Those terms are merely for convenience to facilitate the description based on the embodiments shown in the figures. Those terms are not intended to limit the invention. Thus, it should be recognized that the invention can be described in other ways without those geometric, relational, directional or positioning terms. In addition, the geometric or relational terms may not be exact. For instance, walls may not be exactly perpendicular or parallel to one another but still be considered to be substantially perpendicular or parallel because of, for example, roughness of surfaces, tolerances allowed in manufacturing, etc. And, other suitable geometries and relationships can be provided without departing from the spirit and scope of the invention.

Within this specification, the various sizes, shapes and dimensions are approximate and exemplary to illustrate the scope of the invention and are not limiting. The sizes and the terms "substantially" and "about" mean plus or minus 15-20%, more preferably plus or minus 10%, even more preferably plus or minus 5%, most preferably plus or minus 1-2%. In addition, while specific dimensions, sizes and shapes may be provided in certain embodiments of the invention, those are simply to illustrate the scope of the invention and are not limiting. Thus, other dimensions, sizes and/or shapes can be utilized without departing from the spirit and scope of the invention.

The following documents are incorporated herein by reference: [1] Mak K F, Lee C, Hone J, Shan J and Heinz T F 2010 Atomically thin MoS2: A new direct-gap semiconductor Phys. Rev. Lett. 105 2-5. [2] Britnell L, Ribeiro R M, Eckmann A, Jalil R, Belle B D, Mishchenko A, Kim Y, Gorbachev R V, Georgiou T, Morozov S V, Grigorenko A N, Geim A K, Casiraghi, C, Neto A H C and Novoselov K S 2013 Strong Light-Matter Interactions in Heterostructures of Atomicially Thin Films Science 340 1311-15. [3] Bernardi M, Palummo M and Grossman J C 2013 Extraordinary sunlight absorption and one nanometer thick photovoltaics using two-dimensional monolayer materials Nano Lett. 13 3664-70. [4] Mukherjee S, Maiti R, Midya A, Das S and Ray S K 2015 Tunable Direct Bandgap Optical Transitions in MoS2 Nanocrystals for Photonic Devices ACS Photonics 2 760-768. [5] Xia F, Wang H, Xiao D, Dubey M and Ramasubramaniam 2014 A Two-Dimensional Material Nanophotonics Nat. Photonics 8 899.

[6] Lee G H, Yun Y J, Cui X, Petrone N, Lee C H, Choi M S, Lee D Y, Lee C, Yoo W J, Watanabe K, Taniguchi T, Nuckolls C, Kim P and Hone J 2015 Flexible and transparent MoS2 field-effect transistors on hexagonal boron nitride-graphene heterostructures ACS Nano 7 7931-6. [7] Tahersima M H and Sorger V J 2015 Enhanced photon absorption in spiral nanostructured solar cells using layered 2D materials Nanotechnology 26 344005. [8] Wang Q H, Kalantar-Zadeh K, Kis A, Coleman J N and Strano M S 2012 Electronics and optoelectronics of two-dimensional transition metal dichalcogenides Nat. Nanotechnology. 7 699-712. [9] Mattheiss L F 1973 Band structures of transition-metal-dichalcogenide layer compounds Phys. Rev. B 8 3719-40. [10] Liu Y, Xu F, Zhang Z, Penev E S and Yakobson B I 2014 Two-dimensional mono-elemental semiconductor with electronically inactive defects: The case of phosphorus Nano Lett. 14 6782-6.

[11] Zhang H 2015 Ultrathin Two-Dimensional Nanomaterials ACS Nano 9 9451-69. [12] Song L, Ci L, Lu H, Sorokin P B, Jin C, Ni J, Kvashnin A G, Kvashnin D G, Lou J, Yakobson B I and Ajayan P M 2010 Large scale growth and characterization of atomic hexagonal boron nitride layers Nano Lett. 10 3209-15. [13] Xue J, Sanchez-Yamagishi J, Bulmash D, Jacquod P, Deshpande A, Watanabe K, Taniguchi T, Jarillo-Herrero P and LeRoy B J 2011 Scanning Tunnelling Microscopy and Spectroscopy of ultra-flat graphene on hexagonal boron nitride Nat. Materials 10 282-285. [14] Tahersima M H, Birowosuto M D, Ma Z, Coley W C, Valentin M D, Alvillar S N and Sorger V J 2017 Testbeds for Transition Metal Dichalcogenide Photonics: Efficacy of Light Emission Enhancement in Monomer vs Dimer Nanoscale Antennae ACS Photonics 4(7) 1713-1721.

[15] Bhimanapati G R, Lin Z, Meunier V, Jung Y, Cha J, Das S, Xiao D, Son Y, Strano M S, Cooper V R, Liang L, Louie S G, Ringe E, Zhou W, Kim S S, Naik R R, Sumpter B G, Terrones H, Xia F, Wang Y, Zhu J, Akinwande D, Alem N, Schuller J A, Schaak R E, Terrones M and Robinson J A 2015 Recent Advances in Two-Dimensional Materials beyond Graphene ACS Nano 9 11509-39. [16] Li L, Yu Y, Ye G J, Ge Q. Ou X, Wu H, Feng D, Chen X H and Zhang Y Black 2014 phosphorus field-effect transistors Nat. Nano 9 372-7. [17] Xia F, Wang H and Jia Y 2014 Rediscovering black phosphorus as an anisotropic layered material for optoelectronics and electronics Nat. Communications 5 4458. [18] Mak K F and Shan J 2016 Photonics and optoelectronics of 2D semiconductor transition metal dichalcogenides Nat. Photonics 10 216-26.

[19] Chowdhury R K, Maiti R, Ghorai A, Midya A and Ray S K 2016 Novel silicon compatible p-WS 2 2D/3D heterojunction devices exhibiting broadband photoresponse and superior detectivity Nanoscale 8 13429-36. [20] Kang J, Li J, Li S S, Xia J B and Wang L W 2013 Electronic structural Moiré pattern effects on MoS2/MoSe2 2D heterostructures Nano Lett. 13 5485-90. [21] Wang Q H, Kalantar-Zadeh K, Kis A, Coleman J N and Strano M S 2012 Electronics and optoelectronics of two-dimensional transition metal dichalcogenides Nat. Nanotechnol. 7 699-712. [22] Plechinger G, Mann J, Preciado E, Barroso D, Nguyen A, Eroms J, Schueller C, Bartels L and Korn T 2014 A direct comparison of CVD-grown and exfoliated MoS2 using optical spectroscopy Semiconductor Science and Technology 29(6) 064008.

[23] Ma Z, Hemnani R, Bartels L, Agarwal R and Sorger V J 2017 2D Materials in Electro-optic Modulation: energy efficiency, electrostatics, mode overlap, material transfer and integration arXiv preprint arXiv:1708.05986. [24] Schneider G F, Calado V E, Zandbergen H, Vandersypen L M K and Dekker C 2010 Wedging transfer of nanostructures. Nano Lett. 10 1912-6. [25] Zomer P J, Dash S P, Tombros N, and Van Wees B J 2011 A new transfer technique for high mobility graphene devices on commercially available hexagonal boron nitride Appl. Phys. Lett. 99 232104. [26] Li N, Liu K, Sorger V J and Sadana D K 2015 Monolithic III-V on silicon plasmonic nanolaser structure for optical interconnects Sci. Rep. 5 1-9.

[27] Liu K, and Sorger V J 2015 Electrically-driven carbon nanotube-based plasmonic laser on silicon Opt. Mater. Express 5 1910. [28] Lotsch B V 2015 Vertical 2D Heterostructures Annu. Rev. Mater. Res. 45 85-109. [29] Castellanos-Gomez A, Buscema M, Molenaar R, Singh V, Janssen L, Van Der Zant H S J and Steele G A 2014 Deterministic transfer of two-dimensional materials by all-dry viscoelastic stamping 2D Mater. 1 011002. [30] Li H, Wu J, Huang X, Lu G, Yang J, Lu X, Xiong Q and Zhang H 2013 Rapid and reliable thickness identification of two-dimensional nanosheets using optical microscopy ACS Nano 7 10344-53. [31] Late D J, Liu B, Matte H S S R, Rao C N R and Dravid V P 2012 Rapid characterization of ultrathin layers of chalcogenides on SiO2/Si substrates Adv. Funct. Mater. 22 1894-905. [32] Chen Y F, Liu D, Wang Z G, Li P J, Hao X, Cheng K, Fu Y, Huang L X, Liu X Z, Zhang W L and Li Y R 2011 Rapid determination of the thickness of graphene using the ratio of color difference J. Phys. Chem. C 115 6690-6693. [33] Meitl M A, Zhu Z T, Kumar V, Lee K J, Feng X, Huang Y Y, Adesida I, Nuzzo R G and Rogers J A 2006 Transfer printing by kinetic control of adhesion to an elastomeric stamp Nat. Materials 5 33-8. [34] Amin R, Khurgin J B and Sorger V J 2017 Waveguide-based Electroabsorption Modulator Performance arXiv preprint arXiv:1712.02837.

The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A material transfer system for transferring 2-dimensional (2D) material to or from a substrate, said system comprising:
   a transfer apparatus having a transfer material holder for retaining a transfer material; and
   a stamping apparatus having a transfer-stamper, and a stamping positioner coupled with said transfer-stamper to align said transfer-stamper with and engage the transfer material and press the transfer material into contact with the substrate to thereby transfer the 2D material to or from the substrate.

2. The material transfer system of claim 1, said transfer apparatus further comprising a transfer positioner coupled with said transfer material holder to align the transfer material with the substrate.

3. The material transfer system of claim 2, wherein said stamping positioner moves in a z-direction, and said transfer positioner moves in an x-direction and a y-direction.

4. The material transfer system of claim 2, wherein said stamping positioner and said transfer positioner each move in an x-, y- and z-direction.

5. The material transfer system of claim 2, further comprising a controller in communication with said transfer apparatus and said stamping apparatus, said controller providing a control signal to said transfer positioner and said stamping positioner to position said transfer material and said transfer-stamper.

6. The material transfer system of claim 1, further comprising an (x, y, z) registration device to align said transfer material and the substrate.

7. The material transfer system of claim 1, further comprising a controller in communication with said registration device to determine if said transfer-stamper is in alignment with said transfer material and the substrate.

8. The material transfer system of claim 6, further comprising a substrate holder for retaining the substrate, and a substrate positioner, wherein said controller is in communication with said substrate positioner and sends a control signal to said positioner to align said substrate holder with said transfer-stamper.

9. The material transfer system of claim 1, said transfer-stamper having a distal end that engages the transfer material and presses the transfer material into contact with the substrate.

10. The material transfer system of claim 9, wherein said distal end is flat.

11. The material transfer system of claim 1, wherein said transfer material comprises a mechanically bendable and optically transparent material.

12. The material transfer system of claim 11, wherein said transfer material comprises Polydimethylsiloxane.

13. The material transfer system of claim 1, wherein said transfer material is aligned in a first plane, the substrate is aligned in a second plane substantially parallel to the first plane, and the transfer-stamper moves in a stamping direction that is substantially perpendicular to the first and second planes.

14. The material transfer system of claim 1, further comprising a controller in communication with said stamping apparatus, said controller providing a control signal to said stamping positioner to move said transfer-stamper.

15. The material transfer system of claim 1, wherein said transfer-stamper is elongated and presses said transfer material to the substrate.

16. The material transfer system of claim 1, wherein the 2D material comprises a flake or film, or is included with multiple layered materials, or as a 2D film in heterogeneous layered materials.

17. The material transfer system of claim 1, wherein the transfer-stamper has a flat end.

18. The material transfer system of claim 1, wherein the 2D material comprises a flake or film, or is included with multiple layered materials, or as a 2D film in hetero-layers of 2D films.

19. A material transfer system for transferring a flake from a first substrate to a second substrate, the first substrate in a first plane and the second substrate in a second plane substantially parallel to the first substrate, said system comprising:
   a mechanically bendable and optically transparent (MBOT) material apparatus having a holder for retaining a MBOT material, and a MBOT positioner coupled with said MBOT holder to respectively align the MBOT material with the first substrate and the second substrate; and
   a stamping apparatus having a transfer-stamper with a distal or flat end face, and a stamping positioner coupled with said transfer-stamper to align said transfer-stamper with and engage the MBOT material and respectively press the MBOT material into contact with the first substrate and the second substrate to thereby transfer the flake from the first substrate to the second substrate, wherein said stamping positioner moves in a direction substantially orthogonal to the first and second planes.

* * * * *